(12) United States Patent
Hioki et al.

(10) Patent No.: US 8,198,647 B2
(45) Date of Patent: Jun. 12, 2012

(54) LIGHT EMITTING APPARATUS

(75) Inventors: Tsuyoshi Hioki, Kanagawa-ken (JP); Yutaka Nakai, Kanagawa-ken (JP); Noburu Fukushima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 12/624,606

(22) Filed: Nov. 24, 2009

(65) Prior Publication Data

US 2010/0127296 A1 May 27, 2010

(30) Foreign Application Priority Data

Nov. 25, 2008 (JP) ................................. 2008-299844

(51) Int. Cl.
*H01L 33/00* (2010.01)

(52) U.S. Cl. ................. 257/98; 257/79; 438/26

(58) Field of Classification Search ............... 257/79.98, 257/99; 438/26, E33.056, E33.067
See application file for complete search history.

(56) References Cited

U.S. PATENT DOCUMENTS

| 6,809,021 | B2* | 10/2004 | Ohtani et al. .................. 438/622 |
| 6,831,727 | B2 | 12/2004 | Akiyama et al. |
| 6,936,912 | B2 | 8/2005 | Akiyama et al. |
| 6,987,284 | B2 | 1/2006 | Hioki et al. |
| 7,274,044 | B2* | 9/2007 | Kawakami et al. ............. 257/98 |
| 7,488,986 | B2* | 2/2009 | Yamazaki et al. ............. 257/93 |
| 7,786,496 | B2* | 8/2010 | Yamazaki et al. ............. 257/98 |
| 8,044,580 | B2* | 10/2011 | Yamazaki et al. ............ 313/506 |
| 2004/0027586 | A1* | 2/2004 | Ichikawa et al. .............. 356/614 |
| 2008/0070623 | A1* | 3/2008 | Ogawa ....................... 455/556.1 |

FOREIGN PATENT DOCUMENTS

| JP | 63-237968 | 10/1988 |
| JP | 3-295267 | 12/1991 |
| JP | 6-53481 | 2/1994 |
| JP | 2002-336275 | 11/2002 |
| JP | 2003-282878 | 10/2003 |
| JP | 2004-300530 | 10/2004 |
| JP | 2004-349543 | 12/2004 |
| JP | 2006-517738 | 7/2006 |
| JP | 2007-59894 | 3/2007 |
| JP | 2007-88076 | 4/2007 |
| JP | 2007-123348 | 5/2007 |
| JP | 2007-226246 | 9/2007 |
| JP | 2007-266049 | 10/2007 |
| JP | 2008-47809 | 2/2008 |
| JP | 2008-277689 | 11/2008 |

\* cited by examiner

*Primary Examiner* — Phuc Dang
(74) *Attorney, Agent, or Firm* — Oblon, Spivak, McClelland, Maier & Neustadt, L.L.P.

(57) ABSTRACT

A light emitting apparatus, includes: a substrate; a semiconductor device including a semiconductor layer formed integrally on a major surface of the substrate; and a light emitting device formed separately from the substrate. The light emitting device is mounted on the major surface of the substrate, electrically connected to the semiconductor device, and thermally connected to the substrate.

16 Claims, 12 Drawing Sheets

LIGHT EMITTING APPARATUS

CROSS-REFERENCE TO RELATED APPLICATIONS

This application is based upon and claims the benefit of priority from the prior Japanese Patent Application No. 2008-299844, filed on Nov. 25, 2008; the entire contents of which are incorporated herein by reference.

BACKGROUND OF THE INVENTION

1. Field of the Invention

The invention relates to a light emitting apparatus and a method for manufacturing the same.

2. Background Art

In the field of light emitting apparatuses for lighting appliances and the like, improvements in recent years of the performance of solid state light emitting devices such as LEDs (Light Emitting Diodes) and LDs (Laser Diodes) have enabled rapid progress to replace incandescent lightbulbs and fluorescent lamps with solid state light emitting apparatuses. Reasons driving such progress for solid state light emitting devices include long life, the lack of toxic substances, and great energy conservation benefits for lighting appliances, which account for several ten % of the total energy consumption.

Conventionally, when applying solid state light emitting devices to lighting appliances and the like, a solid state light emitting device package including, for example, a solid state light emitting device chip combined with a fluorescer to emit white light is mounted on a printed circuit board with an IC forming control/drive circuits and the like and electronic components such as resistors, diodes, condensers, etc.

In such a case, the heat produced by the solid state light emitting device causes the luminous efficacy of the chip to decrease and the life of the chip and the electronic components, etc., recited above to shorten. Such problems are extremely serious for practical use, and technology has been discussed to use, for example, a substrate having a structure of at least two layers of an isotropic thermally conductive layer and an anisotropic thermally conductive layer to efficiently dissipate heat from an LED (for example, refer to JP-A 2007-123348 (Kokai)).

Further, the conventional art of individually constructing each of the IC forming control/drive circuits and the like and the electronic components such as resistors, diodes, condensers, etc., and then disposing the same on a printed circuit board is time-consuming and costly. Moreover, in the case where many solid state light emitting devices are arranged to form an illumination apparatus having a large surface area, many more electronic components are necessary to monitor and control the intensity of the emitted light of each of the solid state light emitting devices to obtain uniform illumination; the interconnects for such electronic components become complex; and problems during manufacturing are even more serious.

On the other hand, display apparatuses using, for example, liquid crystals, organic electroluminescence (EL), and the like use substrates on which thin film transistors (TFTs) and interconnects are formed for pixel driving. Providing solid state light emitting devices on such substrates is expected to eliminate manufacturing problems because the interconnects and the various electronic devices for driving the solid state light emitting devices can be formed collectively on the substrate in any configuration. However, glass substrates normally used in display apparatuses and the like have low thermal conductivities; and it is difficult to dissipate heat efficiently from the solid state light emitting device. Moreover, glass substrates are transparent and undesirably reduce the efficiency as a light emitting apparatus because the light emitted by the solid state light emitting device also is emitted from the bottom side of the substrate.

SUMMARY OF THE INVENTION

According to an aspect of the invention, there is provided a light emitting apparatus, including: a substrate; a semiconductor device including a semiconductor layer formed integrally on a major surface of the substrate; and a light emitting device formed separately from the substrate, the light emitting device being mounted on the major surface of the substrate, electrically connected to the semiconductor device, and thermally connected to the substrate.

According to another aspect of the invention, there is provided a method for manufacturing a light emitting apparatus, the apparatus including a semiconductor device provided on a major surface of a substrate and a light emitting device provided on the major surface of the substrate, the light emitting device being electrically connected to the semiconductor device, the method including: forming an insulating layer on the major surface of the substrate; forming a semiconductor layer on the insulating layer and forming the semiconductor device to include the semiconductor layer; and mounting the light emitting device onto the major surface of the substrate to connect the light emitting device to the substrate through an opening of the insulating layer.

According to still another aspect of the invention, there is provided a method for manufacturing a light emitting apparatus, the apparatus including a semiconductor device provided on a major surface of a substrate and a light emitting device provided on the major surface of the substrate, the light emitting device being electrically connected to the semiconductor device, the method including: forming an insulating layer on a support substrate; forming a semiconductor layer on the insulating layer and forming the semiconductor device to include the semiconductor layer; removing the support substrate; bonding the semiconductor device to the substrate; and mounting the light emitting device onto the major surface of the substrate to connect the light emitting device to the substrate through an opening of the insulating layer.

DETAILED DESCRIPTION OF THE INVENTION

Figure 1:
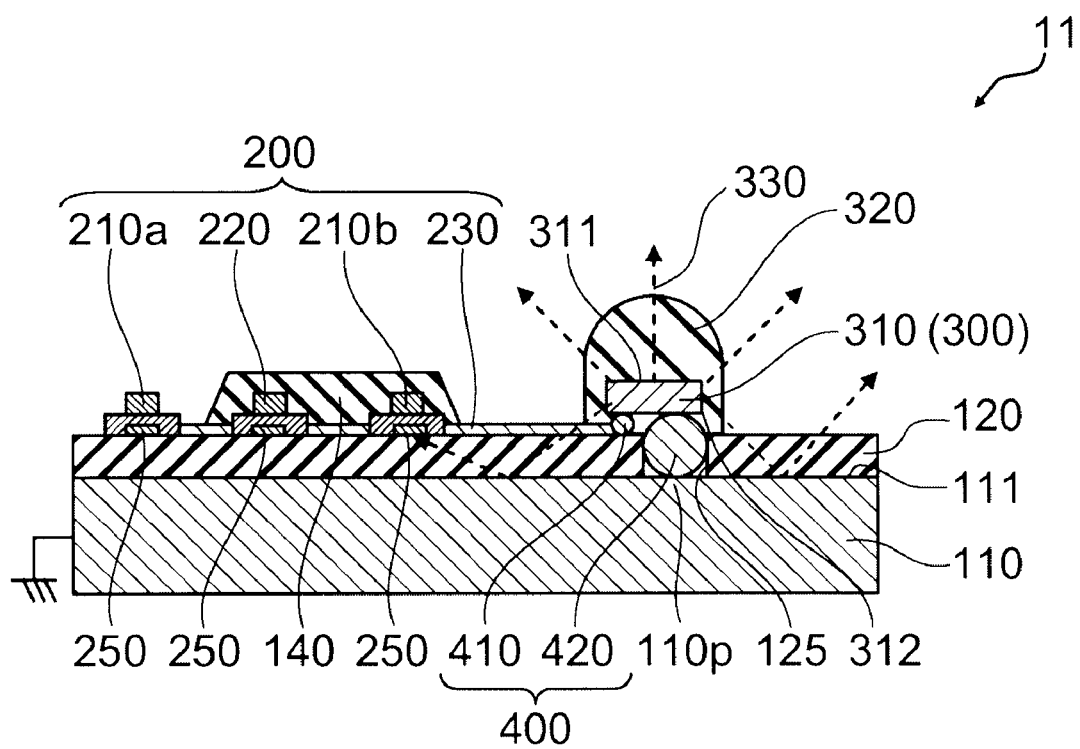
FIG. 1 is a schematic cross-sectional view illustrating the configuration of a light emitting apparatus according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

FIG. 1 is a schematic cross-sectional view illustrating the configuration of a light emitting apparatus according to a first embodiment of the invention.

Figure 2:
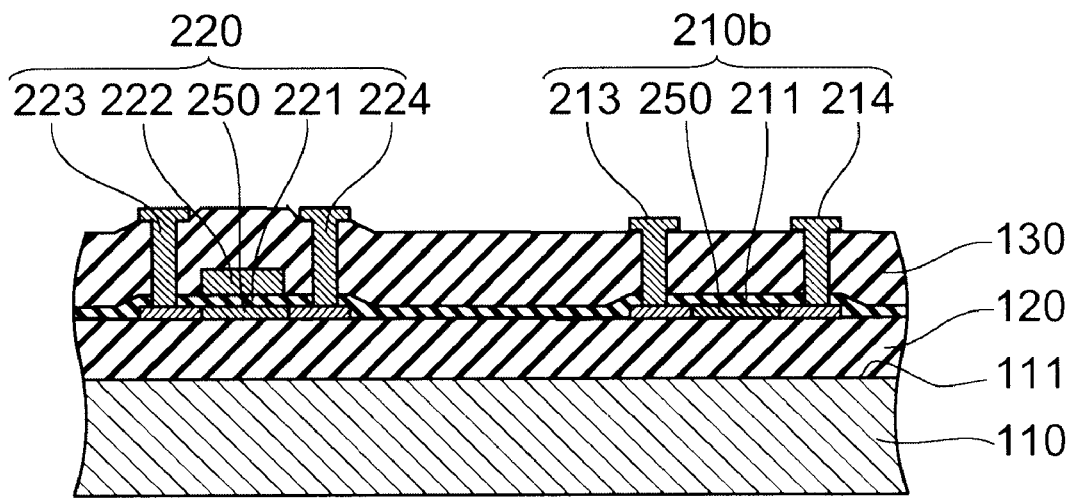
FIG. 2 is a schematic cross-sectional view illustrating the configuration of a portion of the light emitting apparatus according to the first embodiment of the invention.

FIG. 2 is a schematic cross-sectional view illustrating the configuration of a portion of the light emitting apparatus according to the first embodiment of the invention.

Figure 3:
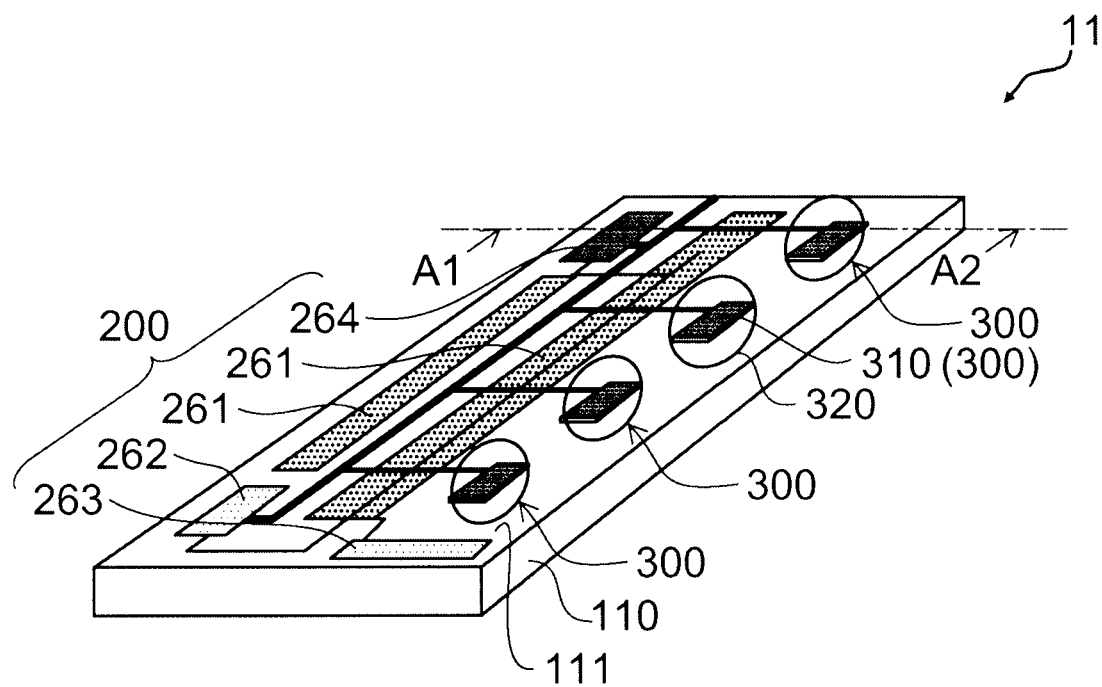
FIG. 3 is a schematic perspective view illustrating the configuration of the light emitting apparatus according to the first embodiment of the invention.

FIG. 3 is a schematic perspective view illustrating the configuration of the light emitting apparatus according to the first embodiment of the invention.

Namely, FIG. 1 illustrates the cross section along line A1-A2 of FIG. 3.

First, the schematic structure of the light emitting apparatus according to the first embodiment of the invention of FIG. 3 will be described.

Namely, as illustrated in FIG. 3, a light emitting apparatus 11 according to this embodiment includes a substrate 110 and light emitting devices 300 provided on a major surface 111 of the substrate 110.

A semiconductor device 200 including a semiconductor layer 250 (not illustrated) is provided on the major surface 111 of the substrate 110. The light emitting devices 300 are electrically connected to the semiconductor device 200.

The light emitting devices 300 may include various light emitting device chips 310 including light emitting layers such as LEDs and LDs. That is, the light emitting device 300 may include at least one of a light emitting diode and a laser diode. Each of the light emitting devices 300 may further include a fluorescer-containing layer 320 (wavelength conversion layer) described below in addition to the light emitting device chip 310. Thereby, for example, white light of any color temperature or light of any color may be emitted. In other words, the light emitting device 300 includes the light emitting device chip 310 and the fluorescer-containing layer 320. Such a light emitting device 300 may be formed separately from the substrate 110. Hereinbelow, the case is described where the light emitting device 300 includes the light emitting device chip 310, and the fluorescer-containing layer 320 is provided separately from the light emitting device 300.

One light emitting device 300 may be provided in the light emitting apparatus 11; multiple light emitting devices 300 may be provided as in this specific example; and multiple light emitting devices 300 may be arranged, for example, two dimensionally to form a light emitting apparatus having a large surface area.

On the other hand, the semiconductor device 200 may include various semiconductor devices using a semiconductor layer (not illustrated) formed integrally on the major surface 111 of the substrate 110, and may include interconnects and the like for convenience.

In this specific example, the semiconductor device 200 includes a drive circuit unit 261 that drives and controls the light emitting devices 300. The semiconductor device 200 also includes a light adjustment sensor unit 262 that detects emitted light for adjusting the light emission intensity of the light emitting devices 300. The semiconductor device 200 may further include a remote control sensor unit 263 including, for example, an infrared sensor that performs a remote control operation of the light emitting apparatus 11, a communication sensor unit 264 for an information communication network, and the like. In other words, the semiconductor device 200 may include a device that performs wireless communication based on at least one of infrared rays and radio waves. However, the invention is not limited thereto. The semiconductor device 200 may include a device having any structure and any function as long as the device uses the semiconductor layer formed integrally on the major surface 111 of the substrate 110.

The cross-sectional structure of the light emitting apparatus 11 will now be described.

As illustrated in FIG. 1, the semiconductor device 200 is provided on the major surface 111 of the substrate 110 and includes the semiconductor layer 250 formed integrally with the substrate 110.

The semiconductor layer 250 may be formed directly on the substrate 110 or may be formed on any insulating layer formed on the substrate 110. As described below, the semiconductor layer 250 (and the semiconductor device 200) may be affixed to the substrate 110 and the semiconductor layer 250 may be considered to be integrally formed on the major surface 111 of the substrate 110 even in the case where the semiconductor layer 250 and subsequently, for example, the semiconductor device 200 are formed on, for example, a support substrate separately from the substrate 110, the semiconductor layer 250 (and the semiconductor device 200) are subsequently peeled from the support substrate, and then the semiconductor layer 250 (and the semiconductor device 200) are affixed to the major surface 111 of the substrate 110.

The light emitting device 300 is formed separately from the substrate 110 and mounted on the major surface 111 of the substrate 110. The light emitting device 300 is electrically connected to the semiconductor device 200.

A portion of the light emitting device 300 is connected to the substrate 110. In other words, the light emitting device 300 is, for example, thermally connected to the substrate 110, and the heat of the light emitting device 300 can be conducted to the substrate 110.

As described above, the light emitting devices 300 may include light emitting device chips 310 of various solid state light emitting devices such as LEDs and LDs.

Each of the light emitting devices 300 may further include the fluorescer-containing layer 320. In other words, the light emitting device 300 may include the light emitting device chip 310 including a light emitting layer and the fluorescer-containing layer 320 that absorbs light emitted by the light emitting device chip 310 and emits light having a wavelength different from that of the absorbed light. However, the fluorescer-containing layer 320 may be provided separately from the light emitting device 300.

In the fluorescer-containing layer 320, a fluorescer mixed in, for example, a resin and the like absorbs light emitted by the light emitting device chip 310 and emits light having a wavelength different from that of the absorbed light. The fluorescer-containing layer 320 is provided to cover a light emitting portion of the light emitting device chip 310. Thus, the light emitting device 300 may be a so-called light emitting device package of an LED, LD, etc., in which the light emitting device chip 310 and the fluorescer-containing layer 320 are integrally formed beforehand. As described below, a configuration is possible in which the light emitting device chip 310 is mounted on the substrate 110, and the fluorescer-containing layer 320 is formed subsequently to cover the light emitting device chip 310. The fluorescer-containing layer 320 is provided as necessary and may be omitted.

The wavelength of the emitted light of the light emitting device chip 310 is arbitrary. The light emitting device 300 may emit, for example, white light of any color temperature or light of any color by combining with the fluorescer-containing layer 320. In this specific example, the light emitting device 300 emits white light by using an LED chip as the light emitting device chip 310 that emits light having, for example, a blue region wavelength around 400 nm and by using a fluorescer in the fluorescer-containing layer 320 that absorbs a portion of the light and performs a wavelength conversion to a wavelength region of a complementary color.

An electrically conductive material having a high thermal conductivity may be used as the substrate 110. In other words, a metal substrate, a carbon material substrate, a nitride material substrate, and the like, for example, may be used as the substrate 110. In this specific example, a stainless steel substrate is used as the substrate 110.

The insulating layer 120 may be provided on the major surface 111 of the substrate 110, and the semiconductor layer 250 may be provided thereupon.

In this specific example, the semiconductor device 200 includes, for example, semiconductor devices such as a TFT 220, a first photodiode 210a, and a second photodiode 210b. Further, in this specific example, a light-shielding layer 140 is provided on the TFT 220 and the second photodiode 210b on the side opposite to the substrate 110. The light-shielding layer 140 is light-shielding with respect to emitted light 330 emitted by the light emitting device 300. The light-shielding layer 140 may be provided as necessary.

However, such a configuration is one example. The semiconductor device 200 may include a device having any configuration including two-terminal or three-terminal configurations. As described above, the semiconductor device 200 may include at least a portion of the drive circuit unit 261 for the light emitting device 300, the light adjustment sensor unit 262, the remote control sensor unit 263, the communication sensor unit 264, and the like shown in FIG. 3.

Hereinbelow, to simplify descriptions, a configuration is described in which the semiconductor device 200 includes a three-terminal TFT 220 and a two-terminal diode (the second photodiode 210b).

As illustrated in FIG. 2, the insulating layer 120 is provided on the major surface 111 of the substrate 110. The insulating layer 120 may include any insulative material such as, for example, silicon oxide, silicon nitride, silicon oxynitride, and aluminum oxide. As described below, in the case where the photodiode 210b senses the light emitted by the light emitting device 300, it is desirable that a material is used having a high transmittance with respect to the wavelength thereof to efficiently transmit the emitted light 330 emitted by the light emitting device 300 in the interior of the insulating layer 120. In this specific example, silicon oxide is used as the insulating layer 120.

The semiconductor layer 250 is provided on the insulating layer 120. The semiconductor layer 250 may include any material such as amorphous silicon, polysilicon (polycrystalline silicon), microcrystalline silicon, oxide semiconductor, organic semiconductor, etc. Hereinbelow, an example is described in which polysilicon is used as the semiconductor layer 250.

The semiconductor layer 250 is patterned into a prescribed configuration to form the TFT 220 and the second photodiode 210b.

For example, the TFT 220 includes the semiconductor layer 250, a gate electrode 222 provided on the semiconductor layer 250, a gate insulating film 221 provided between the semiconductor layer 250 and the gate electrode 222, and a source electrode 223 and a drain electrode 224 connected to the semiconductor layer 250 and provided apart on either side of the gate electrode 222. Then, a passivation film (insulating film) 130 is provided thereupon. In other words, the TFT 220 (the semiconductor device 200) is a transistor having the semiconductor layer 250 as a channel. The source electrode 223 and the drain electrode 224 are mutually interchangeable.

For example, the second photodiode 210b includes the semiconductor layer 250, an insulating film 211 provided on the semiconductor layer 250, and an anode electrode 213 and a cathode electrode 214 connected to the semiconductor layer 250 and provided apart. A passivation film 130 is provided thereupon. The anode electrode 213 and the cathode electrode 214 are mutually interchangeable. The first photodiode 210a also may have a similar configuration.

The passivation film 130 recited above may include any material such as silicon oxide, silicon nitride, and silicon oxynitride. The passivation film 130 is omitted in FIG. 1.

Although omitted in FIG. 2, as described above, the light-shielding layer 140 is provided to cover the passivation film 130 on the TFT 220 and the second photodiode 210b. The light-shielding layer 140 may include any material such as metal, metal oxide, and resins containing carbon and/or various pigments.

The TFT 220, the first photodiode 210a, and the second photodiode 210b may be formed on the insulating layer 120 provided on the major surface 111 of the substrate 110 using technology similar to technology of display apparatuses such as, for example, liquid crystal and organic EL. Using such formation technology, an interconnect 230 is provided on the insulating layer 120 to connect the TFT 220, the first photodiode 210a, the second photodiode 210b, and the like to each other. As recited above, the interconnect 230 also is taken to be included in the semiconductor device 200 for convenience because the interconnect 230 is formed similarly to the semiconductor devices such as the TFT 220, the first photodiode 210a, and the second photodiode 210b.

As illustrated in FIG. 1, the interconnect 230 is aligned, for example, on the insulating layer 120 and electrically connected to the light emitting device 300. In other words, the light emitting device 300 is electrically connected to the semiconductor device 200. In this specific example, a lower face 312 of the light emitting device chip 310 (the light emitting device 300) on the substrate 110 side is electrically connected by, for example, a first bump 410 made of Au and the like. In other words, one electrode selected from, for example, the anode electrode and the cathode electrode provided on the light emitting device 300 is electrically connected to the semiconductor device 200.

Thereby, the semiconductor device 200 (the TFT 220, the first photodiode 210a, the second photodiode 210b, etc.) is electrically connected to the light emitting device 300. The semiconductor device 200 can drive and control the light emitting device 300, detect and use as feedback the emitted light 330 from the light emitting device 300, and perform various controls. Thus, the semiconductor device 200 may include a device to control at least one of a voltage applied to the light emitting device 300 and a current flowing in the light emitting device 300. In such a case, manufacturing is easy and the productivity is high because the semiconductor device 200 can be formed collectively when providing multiple light emitting devices 300 on the substrate 110 and providing the circuits to drive and control the light emitting devices 300. In this manufacturing method, the semiconductor device can be formed with higher integration because TFTs and photodiodes can be manufactured collectively, multiply, and in any configuration.

On the other hand, the light emitting device 300 is connected to the substrate 110. In this specific example, the lower face 312 of the light emitting device chip 310 (the light emitting device 300) is connected to the substrate 110 via, for example, a second bump 420 made of Au and the like. The light emitting device 300 is thereby thermally connected to the substrate 110. In this specific example, the other electrode selected from the anode electrode and the cathode electrode provided on the light emitting device 300, for example, is electrically connected to the substrate 110 by the second bump 420. In such a case, the second bump 420 is, for example, Au, has a high thermal conductivity, and can be easily provided with a large cross-sectional area. Thereby, the light emitting device 300 and the substrate 110 can be simultaneously electrically connected and thermally connected. In other words, the heat produced by the light emitting device 300 is efficiently conducted to the second bump 420 and then conducted from the second bump 420 to the substrate 110. Thereby, the heat of the light emitting device 300 can be efficiently dissipated.

In other words, in this specific example, the substrate 110 is electrically conductive. The insulating layer 120 is provided between the semiconductor layer 250 and the substrate 110 in a portion other than the portion where the light emitting device 300 is electrically connected to the substrate 110. Thereby, the light emitting device 300 is electrically connected to the substrate 110 at a portion 110p.

Thus, the light emitting apparatus 11 according to this embodiment includes: the electrically conductive substrate 110; the semiconductor device 200 including the insulating layer 120 having an opening 125 provided on the major surface 111 of the substrate 110 and the semiconductor layer 250 provided on the insulating layer 120 integrally with the insulating layer 120; and the light emitting device 300 formed separately from the substrate 110. The light emitting device 300 is mounted on the major surface 111 of the substrate 110 and connected to the substrate 110 through the opening 125 of the insulating layer 120 while being electrically connected to the semiconductor device 200. Specifically, the light emitting device 300 is thermally and electrically connected to the substrate 110.

Thereby, the light emitting apparatus 11 according to this embodiment can provide a highly efficient light emitting apparatus that reduces the number of mounted components, enables high integration, and efficiently dissipates the heat from the light emitting device 300.

Connection members 400 such as the first bump 410 and the second bump 420 may be provided as necessary. For example, at least one of the first bump 410 and the second bump 420 may be omitted and the light emitting device 300 may be electrically connected directly to the semiconductor device 200, and the light emitting device 300 may be thermally connected directly to the substrate 110.

In this specific example, the electrical connection between the light emitting device 300 and the semiconductor device 200 and the connection between the light emitting device 300 and the substrate 110 are performed on the surface of the light emitting device 300 on the substrate 110 side. In other words, although the light emitting device chip 310 is mounted on the substrate 110 in a flip chip configuration, the invention is not limited thereto. In other words, it is sufficient that at least one selected from the multiple electrodes (e.g., the anode electrode and the cathode electrode) provided on the light emitting device 300 is electrically connected to the semiconductor device 200 and the light emitting device 300 is thermally connected to the substrate 110.

In other words, as described below, the electrical connection between, for example, the light emitting device 300 and the semiconductor device 200 may be performed by, for example, bonding wire and the like on an upper face 311 of the light emitting device 300 instead of the lower face 312.

It is sufficient that the substrate 110 functions to conduct and dissipate the heat produced by the light emitting device 300, and it is not always necessary for the substrate 110 and the light emitting device 300 to be electrically connected. In such a case, the multiple electrodes of the light emitting device 300 may be connected to, for example, an electrically conductive layer provided on the insulating layer 120 to drive the light emitting device 300, and the substrate 110 may conduct only heat. In such a case, an insulative substrate may be used as the substrate 110, and the insulating layer 120 may be omitted. In such a case, for example, by using a substrate 110 including a light-shielding material with respect to the emitted light 330 of the light emitting device 300 having high thermal conductivity, the emitted light 330 of the light emitting device 300 can be prevented from being emitted to the side of the substrate 110 opposite to the major surface 111, and the utilization efficiency of light can be increased.

Such a configuration also can provide a highly efficient light emitting apparatus that reduces the number of mounted components, enables high integration, and efficiently dissipates the heat from the light emitting device 300.

Although a material having a high thermal conductivity may be used as the substrate 110 to increase the dissipation efficiency, materials having high thermal conductivities and high practical usability from the viewpoint of cost and the like generally are electrically conductive. For example, metal may be used as the substrate 110. As in this specific example, heat dissipation may be performed simultaneously with the electrical connection by using a metal substrate such as stainless steel as the substrate 110 in combination with a flip chip structure. In other words, the second bump 420 can supply the current to the light emitting device 300 and simultaneously dissipate the heat produced by the light emitting device 300 to the substrate 110, which has a large thermal capacity, without adding a special component. Accordingly, it is advantageous to use an electrically conductive material having thermal conductivity (e.g., metal) as the substrate 110 and use a structure of the light emitting apparatus 11 in which the insulating layer 120 is provided thereupon.

In the light emitting apparatus 11 according to this embodiment illustrated in FIG. 1, the insulating layer 120 is provided in a portion other than the portion 110p where the light emitting device 300 is thermally and electrically connected to the substrate 110. In other words, the insulating layer 120 includes the opening 125 at the portion 110p where at least the connection member 400 (the second bump 420) is provided. Thereby, the light emitting device 300 is thermally and electrically connected to the substrate 110.

However, the invention is not limited thereto. Namely, in the case where a material having a relatively high thermal conductivity is used as the insulating layer 120, the light emitting device 300 may be provided on the insulating layer 120 without providing the opening 125; and the light emitting device 300 may be thermally connected to the substrate 110 via the insulating layer 120. In such a case, for example, the insulating layer 120 performs the function of transmitting heat between the light emitting device 300 and the substrate 110 while ensuring insulative properties on the electrically conductive substrate 110. Accordingly, another method (e.g., bonding wire, etc.) may be used in the case where the substrate 110 is electrically connected to the light emitting device 300. In such a case, a configuration is possible in which all of the multiple electrodes of the light emitting device 300 are connected to the interconnect 230 provided on the insulating layer 120. Insulative materials having relatively high thermal conductivities include, for example, SiC, AlN, and the like.

Such a configuration also can provide a highly efficient light emitting apparatus that reduces the number of mounted components, enables high integration, and efficiently dissipates the heat from the light emitting device 300.

A circuit will now be described for the case where the semiconductor device 200 is the drive circuit unit 261 of the light emitting device 300.

Figure 4:
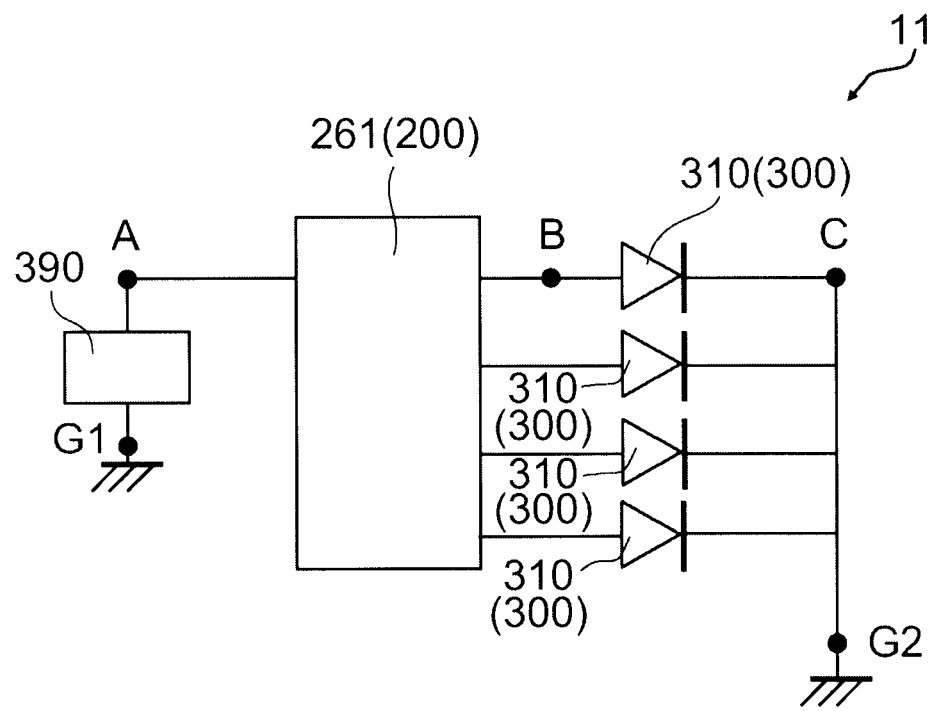
FIG. 4 is a schematic circuit diagram illustrating the configuration of the light emitting apparatus according to the first embodiment of the invention.

FIG. 4 is a schematic circuit diagram illustrating the configuration of the light emitting apparatus according to the first embodiment of the invention.

As illustrated in FIG. 4, in the light emitting apparatus 11 according to this embodiment, for example, the drive circuit unit 261 using the semiconductor device 200 is connected to the light emitting device 300, and a power source 390 is connected to the drive circuit unit 261. In FIG. 4, a power supply system including a power source 390 and point G1 from the outside to the light emitting apparatus 11 is provided to point A. The drive circuit unit 261 provided between point A and point B is formed of the semiconductor device 200 including the semiconductor layer 250 provided on the major surface 111 of the substrate 110. Point B and point C correspond to the two electrode terminals of the LED, i.e., the light emitting device 300. For example, point B corresponds to the first bump 410, and point C corresponds to the second bump 420. The portion between point C and point G2, for example, corresponds to the substrate 110. Thereby, the drive circuit unit 261, i.e., the semiconductor device 200, can drive the light emitting device 300.

First Comparative Example

Figure 5:
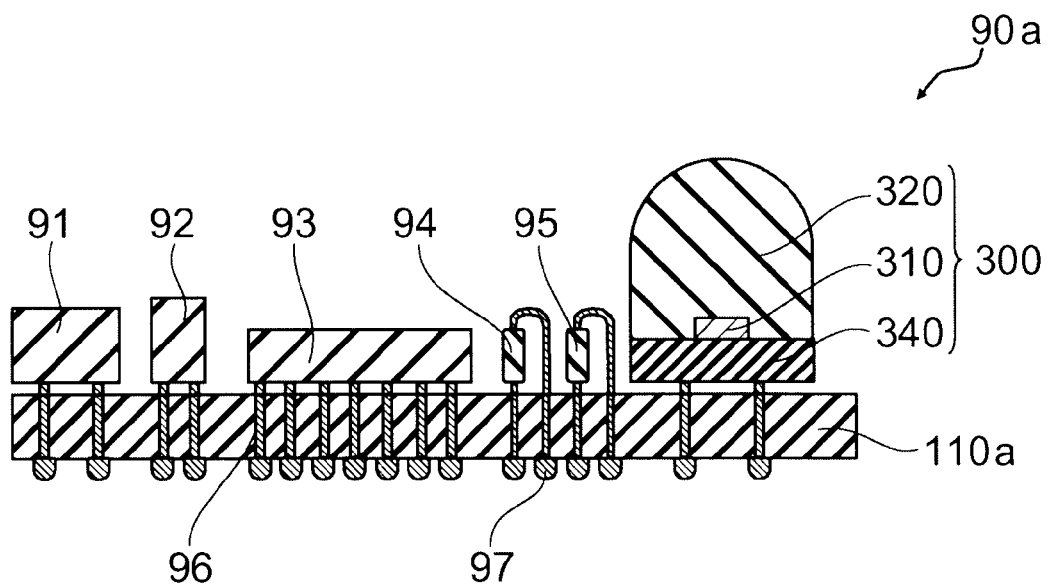
FIG. 5 is a schematic cross-sectional view illustrating the configuration of a light emitting apparatus of a first comparative example.

FIG. 5 is a schematic cross-sectional view illustrating the configuration of a light emitting apparatus of a first comparative example.

In a light emitting apparatus 90a of the first comparative example illustrated in FIG. 5, the light emitting device 300 includes the light emitting device chip 310 of an LED, LD, etc., packaged together with the fluorescer-containing layer 320 and a heat sink 340 and is mounted on, for example, a printed circuit board 110a. A power source connector 91, a control IC 93 forming a drive circuit, a device group including a resistor 95, a current regulative diode 94, and a condenser 92, etc., are mounted on the printed circuit board 110a by solder 97 using connection pins 96 and the like.

Thus, in the light emitting apparatus 90a of the first comparative example, although the control IC 93 forming the drive circuit and the device group such as the resistor 95, the current regulative diode 94, and the condenser 92 are constructed individually and disposed on the printed circuit board 110a, the configuration is time-consuming and costly. Moreover, in the case where many of the light emitting devices 300 are arranged to form a light emitting apparatus having a large surface area, it is necessary to form leads on the printed circuit board 110a to the portions where each of the light emitting devices 300 are positioned, which also may become time-consuming and costly. To monitor and control the intensity of the emitted light of each of the light emitting devices to obtain uniform illumination, it is necessary to separately provide sensor devices such as photodiodes, and further, it is necessary to add a circuit system for controlling the same. Moreover, it is necessary to dispose each of the devices such as the light emitting devices 300, the devices forming the drive circuit, the sensor devices, and the devices of the control circuit, etc., so as not to interfere optically and electrically. Such a design also is time-consuming. Further, it is necessary that a circuit system for processing information from the sensor device and providing feedback to the light emitting device 300 is disposed proximally to the light emitting device, or that a separate group of leads is disposed to the circuit system for the operation processing of the light emitting device 300. Thus, increasing the functionality of the illumination device may result in a higher number of components, increased processes, and higher costs.

Thus, in the light emitting apparatus 90a of the first comparative example, devices are provided individually to drive and control the light emitting device 300. Therefore, the number of mounted components increases, and manufacturing is difficult.

Additionally, a material having a relatively low thermal conductivity such as, for example, glass epoxy resin is often used as the printed circuit board 110a. Therefore, the heat from the light emitting device 300 cannot be dissipated efficiently, and the efficiency is poor. As a solution thereof, it is necessary to provide a heat dissipation mechanism such as the heat sink 340 in the light emitting device 300 or separately provide a heat dissipation mechanism such as that recited in JP-A 2007-123348 (Kokai). From this aspect as well, the cost undesirably increases.

Second Comparative Example

Figure 6:
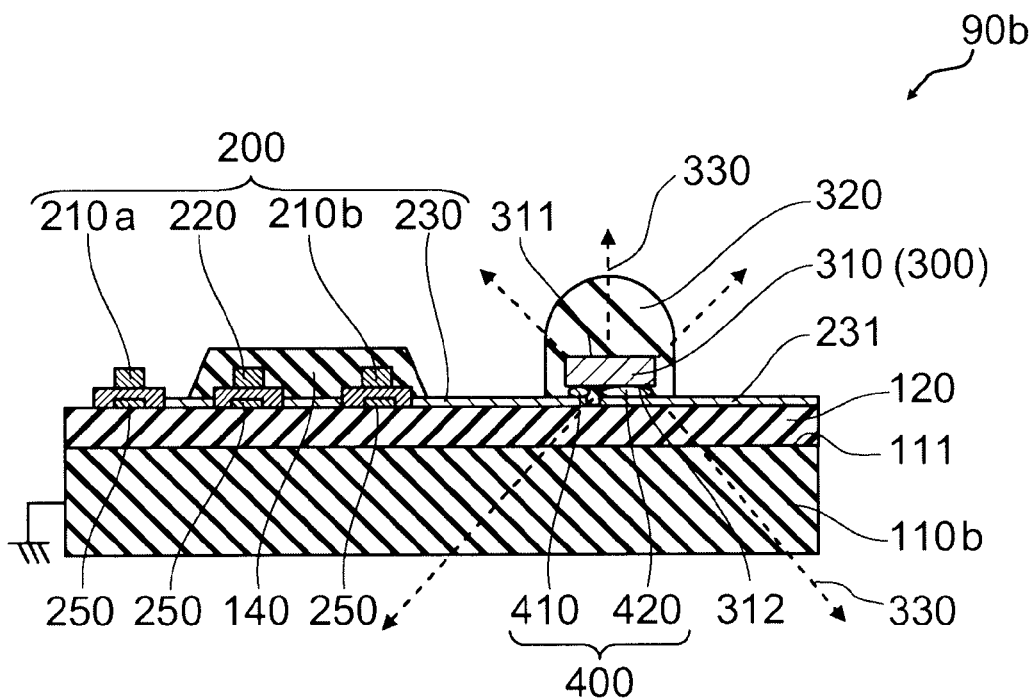
FIG. 6 is a schematic cross-sectional view illustrating the configuration of a light emitting apparatus of a second comparative example.

FIG. 6 is a schematic cross-sectional view illustrating the configuration of a light emitting apparatus of a second comparative example.

In a light emitting apparatus 90b of the second comparative example illustrated in FIG. 6, the substrate 110 of the light emitting apparatus 11 according to this embodiment is replaced with a glass substrate 110b. In other words, in the light emitting apparatus 90b, the light emitting device 300 does not connect to the glass substrate 110b.

That is, the opening 125 is not made in the insulating layer 120 in the light emitting apparatus 90b. Therefore, the two electrodes (not illustrated) of the light emitting device chip 310 are connected to the interconnect 230 and an interconnect 231 formed on the insulating layer 120 by the first bump 410 and the second bump 420, respectively. In other words, the semiconductor device is formed on the glass substrate 110b as if to be used in a display apparatus using, for example, liquid crystals, organic EL, and the like. The light emitting device 300 is mounted on the semiconductor device.

In the case of the light emitting apparatus 90b of the second comparative example having such a configuration, it is difficult to efficiently dissipate the heat from the light emitting device 300 because the glass substrate 110b has a low thermal conductivity. Therefore, the temperature of the light emitting device 300 increases and may cause deterioration of the light emission characteristics and device breakdown. In the case where a heat-dissipating member is separately mounted to diffuse the heat from the light emitting device 300 to prevent such problems, not only may the number of mounted components increase, but the light radiated by the light emitting device 300 may undesirably be impeded because the light emitting device 300 is enclosed by the glass substrate 110b and the heat-dissipating substrate.

Also, as illustrated in FIG. 6, the emitted light 330 from the light emitting device 300 also is emitted from the bottom side of the glass substrate 110b because the glass substrate 110b transmits light having wavelengths in the visible region, and the efficiency as a light emitting apparatus undesirably decreases.

Conversely, in the light emitting apparatus 11 according to this embodiment, the drive circuit unit 261 of the light emitting device 300 and other various electronic components can be formed collectively with the interconnects using the semiconductor layer 250 provided on the major surface 111 of the substrate 110; and the substrate 110 can be connected to the light emitting device 300; and therefore, the heat of the light emitting device 300 can be efficiently dissipated.

Also, by using an electrically conductive and light-shielding material such as metal as the substrate 110, the functions of supplying current to the light emitting device 300 and dissipating heat can be performed simultaneously, and the emitted light 330 from the light emitting device 300 is not transmitted to the side of the bottom face of the substrate 110.

Thus, the light emitting apparatus 11 according to this embodiment can provide a highly efficient light emitting apparatus that reduces the number of mounted components, enables high integration, and efficiently dissipates the heat from the light emitting device 300.

Further, by using such a light emitting apparatus 11, it is possible to precisely control the light emission characteristics and realize any light emission characteristic with high luminance and high uniformity.

Figure 7:
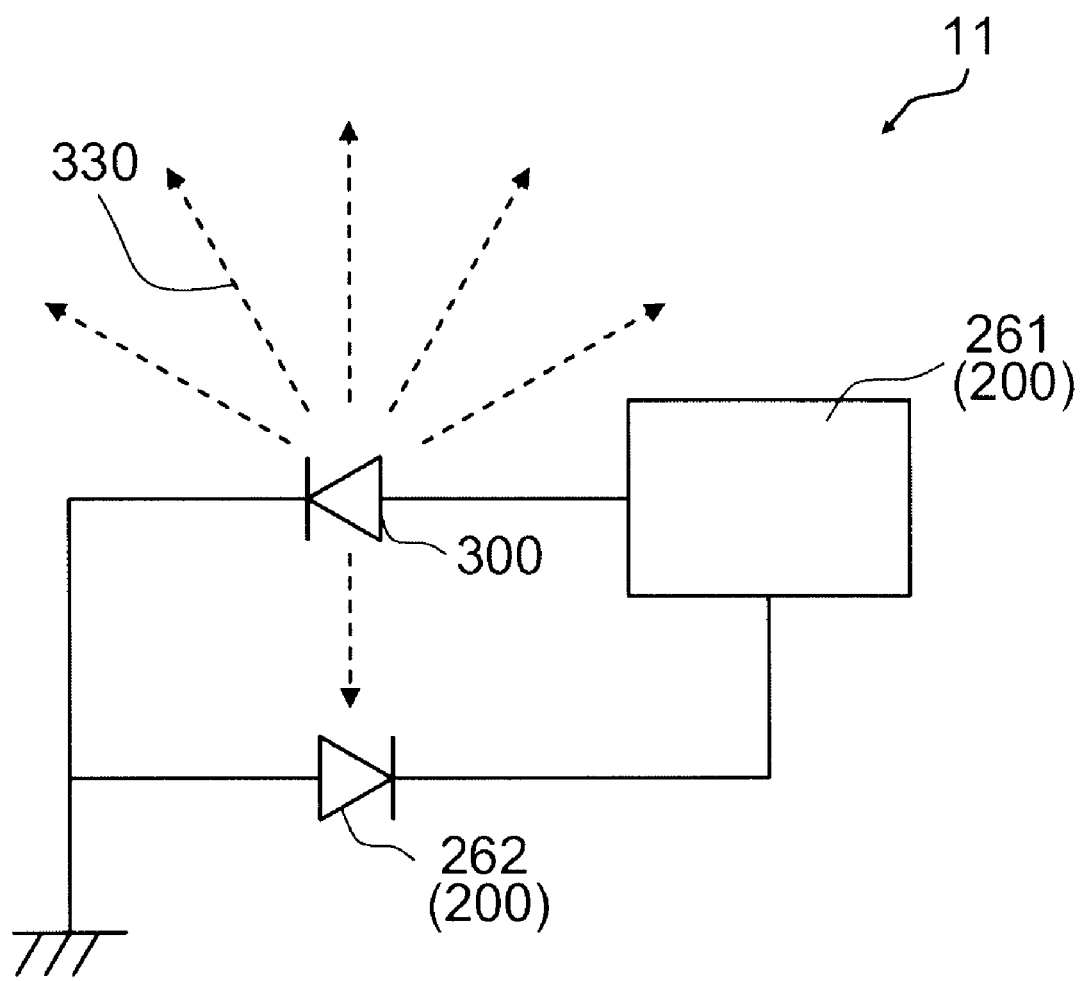
FIG. 7 is another schematic circuit diagram illustrating the configuration of the light emitting apparatus according to the first embodiment of the invention.

FIG. 7 is another schematic circuit diagram illustrating the configuration of the light emitting apparatus according to the first embodiment of the invention.

In the light emitting apparatus 11 according to this embodiment illustrated in FIG. 7, the light adjustment sensor unit 262 is provided to detect, for example, the emitted light 330 from the light emitting device 300. By providing feedback of the light intensity detected by the light adjustment sensor unit 262 to the drive circuit unit 261, the light emission characteristics of the light emitting device 300 can be controlled with high precision. For example, it is easy to collectively provide a photodiode as the light adjustment sensor unit 262 with the drive circuit unit 261 and the like relatively proximally to the light emitting device 300 and add a self-adjustment function to automatically control the current flowing in the light emitting device 300 according to the light intensity of the light emitting device 300. Thereby, for example, it is easier to control the emitted light intensity with high precision by compensating the fluctuation of the light emission intensity of the light emitting device 300 from when the power source is switched ON. As a result, the energy consumption can be reduced, and the life of the light emitting device 300 can be increased.

Further, in addition to circuits that drive and control the light emission characteristics such as the drive circuit unit 261 and the light adjustment sensor unit 262, a control circuit may be formed simultaneously to perform remote operations of ON/OFF and adjustments of the emitted light by providing, for example, the remote control sensor unit 263 and the like described in regard to FIG. 3.

Also, in addition to the function as a light emitting apparatus, it is relatively easy for the light emitting apparatus 11 to include any function other than the light emission function such as, for example, communication functions by simultaneously forming an electronic circuit including various functions such as the communication sensor unit 264 on the substrate 110.

As described above, in the light emitting apparatus 11 according to this embodiment, metal is used as the material of the electrically conductive substrate 110 having a high thermal conductivity. In such a case, as described below, a material transparent to the emitted light 330 emitted by the light emitting device 300 may be used as the insulating layer 120 in the case where the light emitted by the light emitting device 300 is to be sensed by the photodiode 210b. For example, the light emitting device 300 may emit white light, and silicon oxide and the like which transmits white light may be used as the insulating layer 120.

Thus, as illustrated in FIG. 1, the emitted light 330 emitted by the light emitting device 300 may be transmitted in the interior of the insulating layer 120 using the surface (the major surface 111) of the substrate 110 as a reflective surface. Thereby, the emitted light 330 of the light emitting device 300 can be efficiently incident on, for example, the second photodiode 210b of the semiconductor device 200, and the light emission characteristics of the emitted light 330 can be detected with high precision. Thereby, control of the light emitting device 300 is possible with high precision, and the light emission characteristics of the light emitting apparatus 11 can be controlled with high precision.

As illustrated in FIG. 1, in the light emitting apparatus 11 according to this embodiment, the substrate 110 is grounded. In other words, the substrate 110 is provided with an earth potential. Thereby, the potential of the substrate 110 is fixed, and the characteristics of the semiconductor device 200 formed on the major surface 111 of the substrate 110 are stable. In other words, for example, the operation of the TFT 220, i.e., the semiconductor device 200, is stabilized by the substrate 110 functioning as a reference electrode with respect to the TFT 220. However, the invention is not limited thereto. Instead of the grounding potential, the substrate 110 may be set at another fixed potential. In such a case as well, the substrate 110 functions as a standard reference electrode for the TFT 220 to stabilize the operation of the TFT 220.

Although the fluorescer-containing layer 320 is provided to cover the light emitting device chip 310 in FIG. 1, the fluorescer-containing layer 320 may be provided also to cover the semiconductor device 200, and may be provided, for example, to cover the entire surface of the substrate 110 on the side of the semiconductor device 200 and the light emitting device 300.

First Example

A light emitting apparatus 11a (not illustrated) of a first example according to this embodiment will now be described. The configuration of the light emitting apparatus 11a is similar to the configuration of the light emitting apparatus 11 illustrated in FIG. 1, and a description is omitted. In particular, an example of a method for manufacturing the substrate 110 including the semiconductor device 200 used in the light emitting apparatus 11a will now be described in detail.

FIGS. 8A to 8H are schematic cross-sectional views in order of the processes, illustrating the method for manufacturing the light emitting apparatus according to the first example of the invention.

Figure 8A:
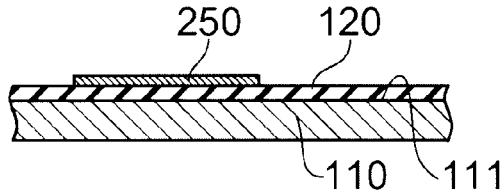
FIGS. 8A to 8H are schematic cross-sectional views in order of the processes, illustrating a method for manufacturing a light emitting apparatus according to a first example of the invention.

As illustrated in FIG. 8A, first, plasma-enhanced chemical vapor deposition (PECVD) was used with, for example, source materials of silane and oxygen gas to deposit a silicon oxide film forming the insulating layer 120 on the major surface 111 of the substrate 110 made of sufficiently cleaned stainless steel. The film formation method of the insulating layer 120 is not limited to PECVD, and any method may be used. Also, the material thereof may include any material such as, for example, a silicon nitride film or a silicon oxynitride film.

Then, for example, after growing a silicon film in an amorphous form using PECVD, the film was multicrystallized by crystallizing the film after instantaneously melting the film by irradiating with an excimer laser using KrF and the like. Then, for example, anisotropic etching was performed using reactive ion etching (RIE) by fluorine-containing gas according to a pattern formed by a photo-etching process to form the semiconductor layer 250 as a polycrystalline silicon layer. The film formation method of the semiconductor layer 250 is not limited to PECVD, and any method may be used. Also, instead of RIE, any method may be used as the patterning method.

Figure 8E:
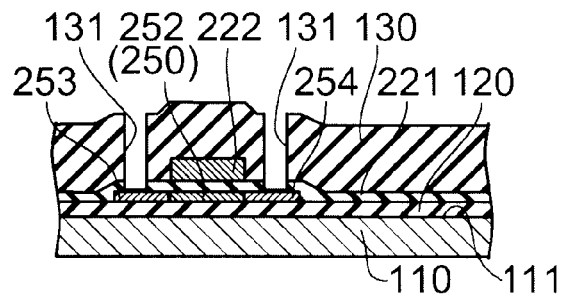
Figure 8B:
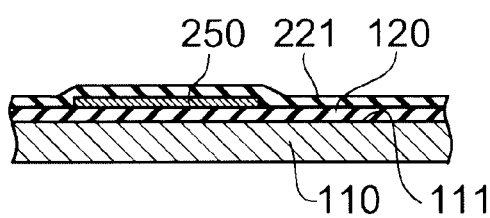

Continuing as illustrated in FIG. 8B, a silicon oxide film was formed to form a gate insulating film 221 using, for example, PECVD. The film formation method of the gate insulating film 221 is not limited to PECVD, and any method may be used. Also, the material thereof may include, for example, any material such as a silicon nitride film or a silicon oxynitride film.

Figure 8F:
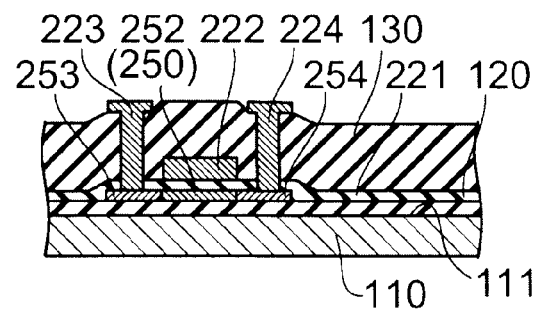
Figure 8C:
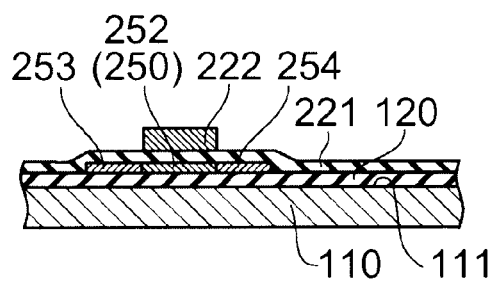

Then, as illustrated in FIG. 8C, a metal film made of Mo was deposited on the gate insulating film 221 using, for example, sputtering. The metal film may include, for example, any material such as Mo, W, Ta, and an alloy thereof. Any film formation method thereof may be used.

Subsequently, a photoresist was coated on the metal film recited above, a resist pattern was formed by photolithography, the metal film was patterned into a configuration by selectively removing the metal film from portions where the resist pattern did not exist, and a gate electrode 222 and a group of gate lines (not illustrated) were formed.

An impurity was introduced to form a junction surface on the semiconductor layer 250. In this example, phosphorus (P) was used as the impurity. At this time, the gate electrode 222 was used as a mask to introduce phosphorus (P) by ion doping with an ion concentration of about $10^{22}$ cm$^{-3}$. Thereby, a contact layer 253 and a contact layer 254 were formed to be connected to the source electrode 223 and the drain electrode 224 described below, respectively. A channel 252 of the TFT 220 also was formed on the substrate 110 side of the gate electrode 222.

Figure 8G:
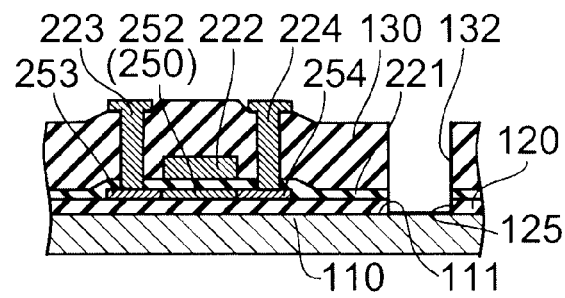
Figure 8D:
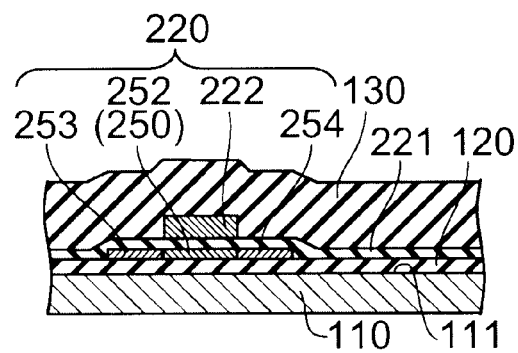

Then, as illustrated in FIG. 8D, a silicon oxide film forming the passivation film 130 was formed on the TFT 220 by, for example, atmospheric pressure chemical vapor deposition (APCVD). The film formation method of the passivation film 130 is not limited to APCVD, and any method may be used. Instead of the silicon oxide film, the material thereof may include any material such as a silicon nitride film or a silicon oxynitride film.

Continuing as illustrated in FIG. 8E, through-holes 131 were made in the passivation film 130 at positions corresponding to the contact layers 253 and 254 by a photo-etching process. In other words, a through-hole also was made in the passivation film 130 at a position corresponding to the first bump 410 illustrated in FIG. 1.

Then, as illustrated in FIG. 8F, Al was deposited using, for example, sputtering to fill the interiors of the through-holes 131, patterning was performed using a photo-etching process, and the source electrode 223 and the drain electrode 224 were formed. The source electrode 223 and the drain electrode 224 may include any electrically conductive material including metal such as Mo, Ta, Ni, alloys thereof, stacked films thereof, etc.

Continuing as illustrated in FIG. 8G, a through-hole 132 between the substrate 110 and the light emitting device 300 was made using a photo-etching process to form a contact in the insulating layer 120, the gate insulating film 221, and the passivation film 130 at a position corresponding to the second bump 420. At this time, the etching of the insulating layer 120, the gate insulating film 221, and the passivation film 130 is possible by, for example, a hydrofluoric acid-based etchant. The opening 125 is made in the insulating layer 120 when making the through-hole 132.

Subsequently, the light-shielding layer 140 (not illustrated) was formed on the TFT 220 and a not-illustrated portion of the photodiode (the second photodiode 210b) using a light-absorbing resist. At this time, the light-shielding layer 140 was opened at the portion of the through-hole 132.

Figure 8H:
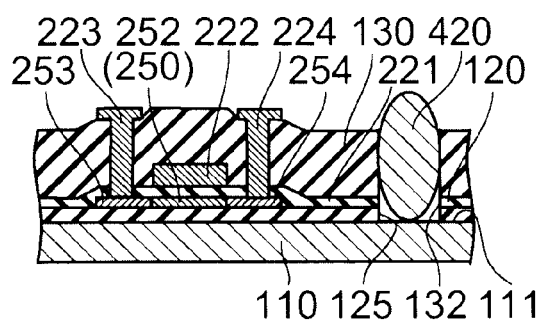

Then, as illustrated in FIG. 8H, the second bump 420 is provided in the portion of the through-hole 132. At this time, the first bump 410 also may be provided in a not-illustrated through-hole. The first bump 410 and the second bump 420 may be provided on the light emitting device chip 310 side instead of being provided on the substrate 110 side.

Subsequently, an LED chip, i.e., the light emitting device chip 310 of the light emitting device 300, was mounted on the substrate 110 using the bumps by a flip chip method. Thereafter, the fluorescer-containing layer 320 was formed by dropping and curing a thermosetting resin containing a fluorescer proximally to the LED chip, and the light emitting apparatus 11*a* having the configuration illustrated in FIG. 1 was constructed.

The light emitting apparatus 11*a* thus constructed according to this example is a highly efficient light emitting apparatus that reduces the number of mounted components, enables high integration, and efficiently dissipates the heat from the light emitting device 300.

A variation of the light emitting apparatus according to this embodiment will now be described.

Figure 9:
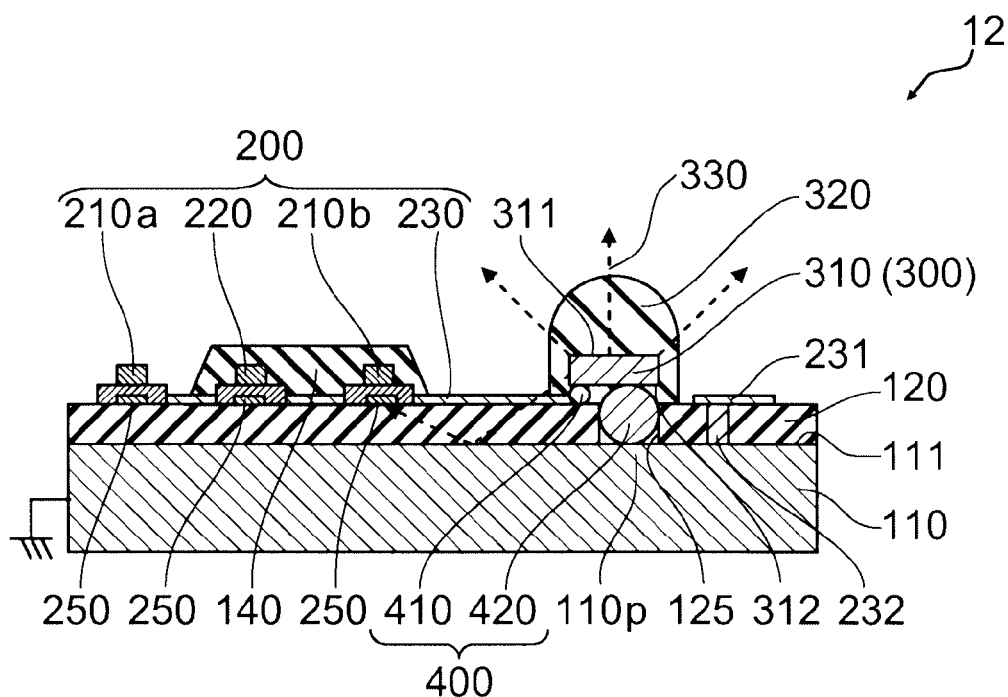
FIG. 9 is a schematic cross-sectional view illustrating the configuration of a light emitting apparatus of a variation according to the first embodiment of the invention.

FIG. 9 is a schematic cross-sectional view illustrating the configuration of a light emitting apparatus of a variation according to the first embodiment of the invention.

As illustrated in FIG. 9, in a light emitting apparatus 12 of the variation according to this embodiment, a through-electrode 232 is provided in the insulating layer 120, and the potential of the substrate 110 is drawn out to the interconnect 231 provided on the upper face of the insulating layer 120. Otherwise, the light emitting apparatus 12 is similar to the light emitting apparatus 11, and a description is omitted.

The interconnect 231 is provided when forming the semiconductor device 200 on the insulating layer 120 and is the same film layer as the various films forming the semiconductor device 200. The interconnect 231 connects to, for example, electrodes of various electronic devices such as the TFT 220 of the semiconductor device 200. Thereby, the interconnect 231 can reference the semiconductor device 200 to the potential of the substrate 110. Thereby, the design of the semiconductor device 200 can be diversified, and the operations of the semiconductor device 200 can be stabilized.

The through-electrode 232 can be formed by making a through-hole similarly to the through-holes 125, and the like made in the insulating layer 120 and filling the through-hole with an electrically conductive material.

Figure 10:
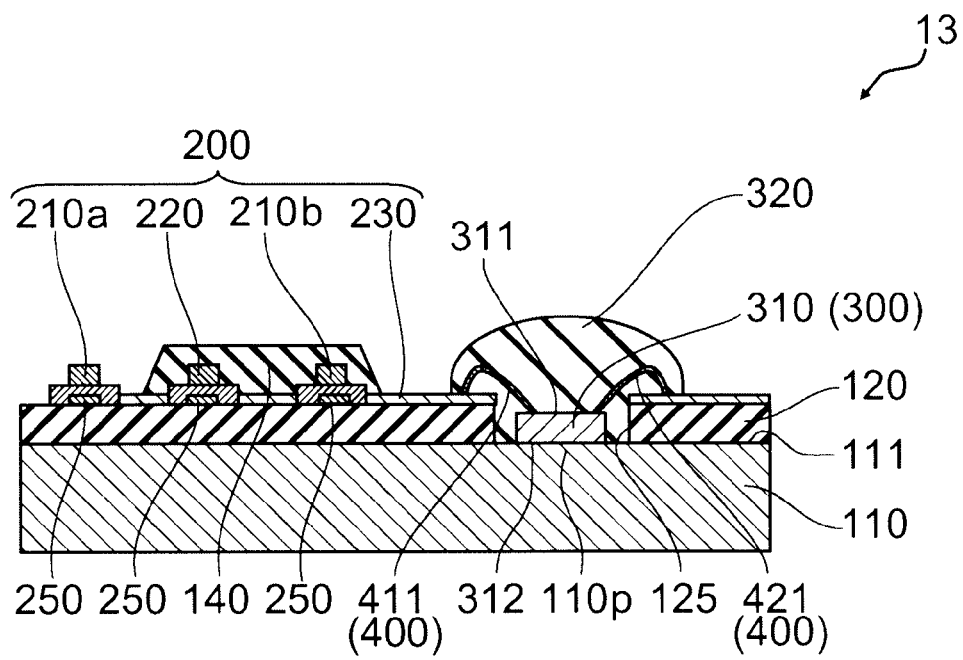
FIG. 10 is a schematic cross-sectional view illustrating the configuration of a light emitting apparatus of another variation according to the first embodiment of the invention.

FIG. 10 is a schematic cross-sectional view illustrating the configuration of a light emitting apparatus of another variation according to the first embodiment of the invention.

In a light emitting apparatus 13 of another variation according to this embodiment illustrated in FIG. 10, a first bonding wire 411 and a second bonding wire 421, for example, are connected to the upper face 311 of the light emitting device chip 310 and connected to the two electrodes of the light emitting device chip 310, respectively. In other words, the electrical connection between the light emitting device 300 and the semiconductor device 200 is made on the surface of the light emitting device 300 on the side opposite to the substrate 110. In the light emitting apparatus 13, the lower face 312 of the light emitting device chip 310 is mounted and thermally connected to the substrate 110 directly or by, for example, electrically conductive paste and the like. Otherwise, the light emitting apparatus 13 is similar to the light emitting apparatus 11, and a description is omitted.

Thus, the electrodes of the light emitting device 300 may be drawn out from the upper face of the light emitting device 300. The light emitting device chip 310 may have a configuration including a reflective surface to control the direction of the emitted light.

Figure 11:
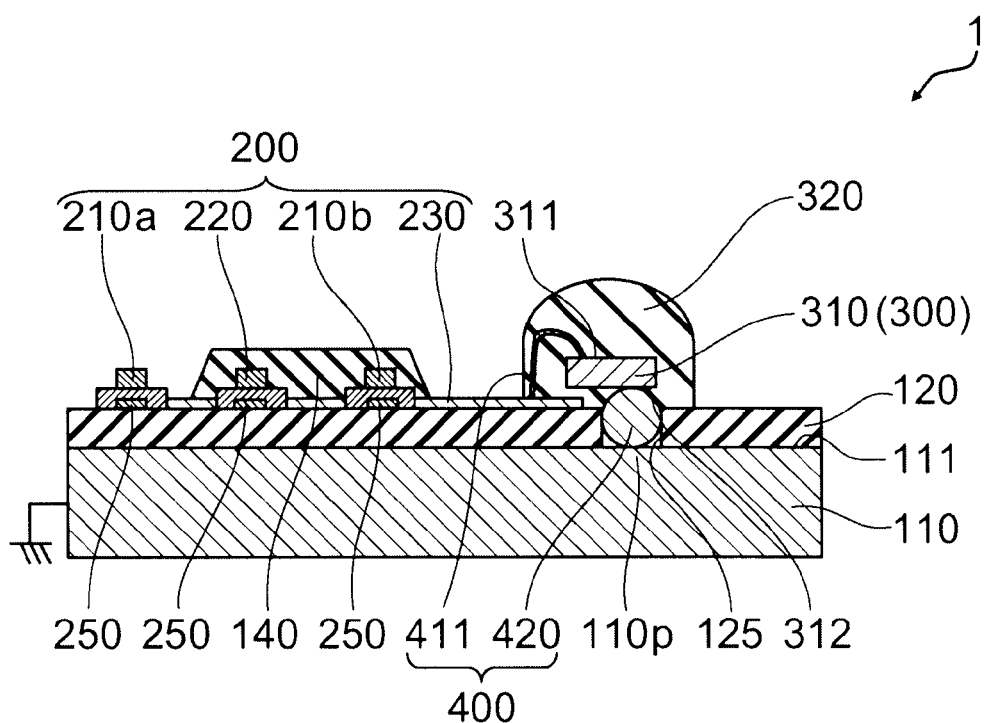
FIG. 11 is a schematic cross-sectional view illustrating the configuration of a light emitting apparatus of another variation according to the first embodiment of the invention.

FIG. 11 is a schematic cross-sectional view illustrating the configuration of a light emitting apparatus of another variation according to the first embodiment of the invention.

In a light emitting apparatus 14 of another variation according to this embodiment illustrated in FIG. 11, the light emitting device chip 310 is connected to the interconnect 230 and electrically connected to the semiconductor device 200 by, for example, the bonding wire 411 drawn out from the upper face 311 of the light emitting device chip 310. On the other hand, the lower face 312 of the light emitting device chip 310 thermally and electrically connects the light emitting device 300 to the substrate 110 via the second bump 420. Otherwise, the light emitting apparatus 14 is similar to the light emitting apparatus 11, and a description is omitted.

Thus, the connection member 400 from the light emitting device 300 may be provided on either the upper face 311 or the lower face 312. As described above, the second bump 420 may be omitted, the lower face 312 of the light emitting device chip 310 may be fixed on the substrate 110 in the state of being thermally (and electrically) connected to the substrate 110 directly or by, for example, electrically conductive paste and the like.

Figure 12:
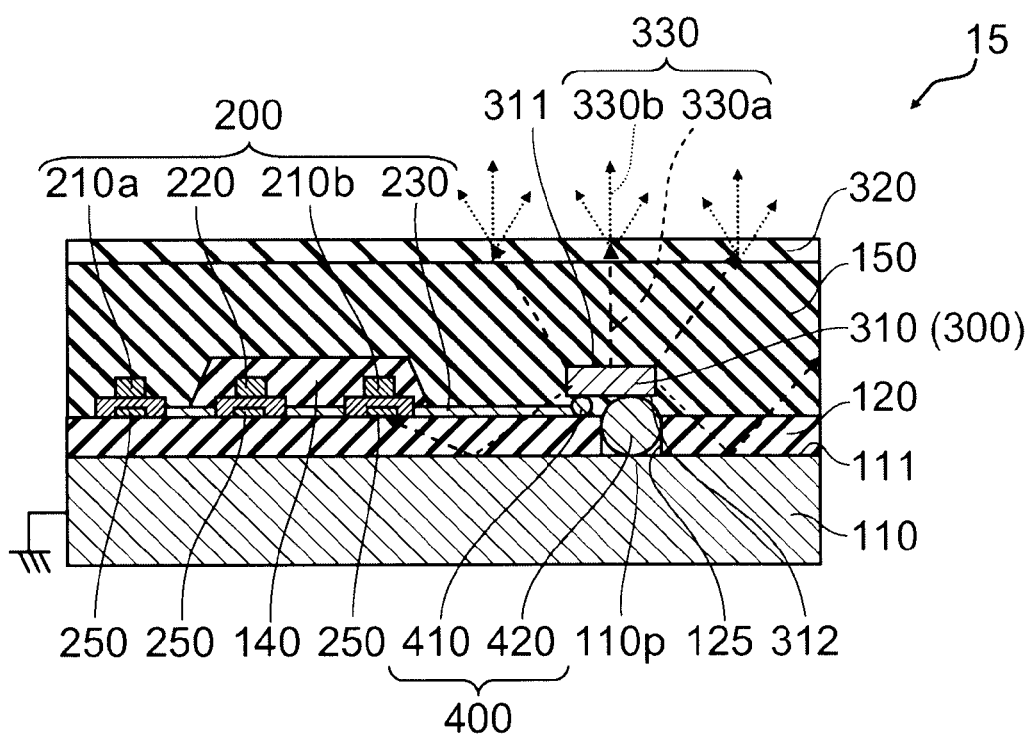
FIG. 12 is a schematic cross-sectional view illustrating the configuration of a light emitting apparatus of another variation according to the first embodiment of the invention.

FIG. 12 is a schematic cross-sectional view illustrating the configuration of a light emitting apparatus of another variation according to the first embodiment of the invention.

In a light emitting apparatus 15 of another variation according to this embodiment illustrated in FIG. 12, a transparent layer 150 is provided to cover the light emitting device chip 310 and the semiconductor device 200. The fluorescer-containing layer 320 is provided thereupon. In other words, the light emitting apparatus 15 has a configuration in which the fluorescer-containing layer 320 is provided on the light emitting device chip 310 via the transparent layer 150 instead of directly. Otherwise, the light emitting apparatus 15 is similar to the light emitting apparatus 11, and a description is omitted.

Thus, the fluorescer-containing layer 320 may be provided on the light emitting device chip 310 via, for example, the transparent layer 150 instead of directly. Thereby, the fluorescer-containing layer 320 absorbs light 330*a* emitted by the light emitting device chip 310 and emits light (wavelength-converted light 330*b*) having a wavelength different from that of the light 330*a*. Thereby, in the case where, for example, white light is produced, the fluorescer-containing layer 320 can produce white emitted light 330 by absorbing a portion of the blue light 330*a* emitted by the light emitting device chip 310 and converting the light 330*a* to light (the wavelength-converted light 330*b*) having a yellow wavelength different from that of the light 330*a*.

Here, the emitted light 330 emitted by the light emitting device 300 includes at least one of the light 330*a* emitted by the light emitting device chip 310 and the wavelength-converted light 330*b* having the wavelength converted by the fluorescer-containing layer 320.

The transparent layer 150 may include a material transparent to the light 330*a* emitted by the light emitting device chip 310 and may include, for example, a transparent resin such as silicone, acryl, polyimide, etc.

In the case where the fluorescer-containing layer 320 is provided on the transparent layer 150, the fluorescer-containing layer 320 may be provided on the entire surface of the transparent layer 150 or may be provided only on a region substantially irradiated with the light 330*a* emitted by the light emitting device chip 310. It is not necessary that the transparent layer 150 is provided to cover the semiconductor device 200, and the transparent layer 150 may be provided to cover only the light emitting device chip 310. In other words, the semiconductor device 200 may be covered with, for example, the light-shielding layer 140, and the transparent layer 150 may be provided on the portion where the light-shielding layer 140 is not provided.

Figure 13:
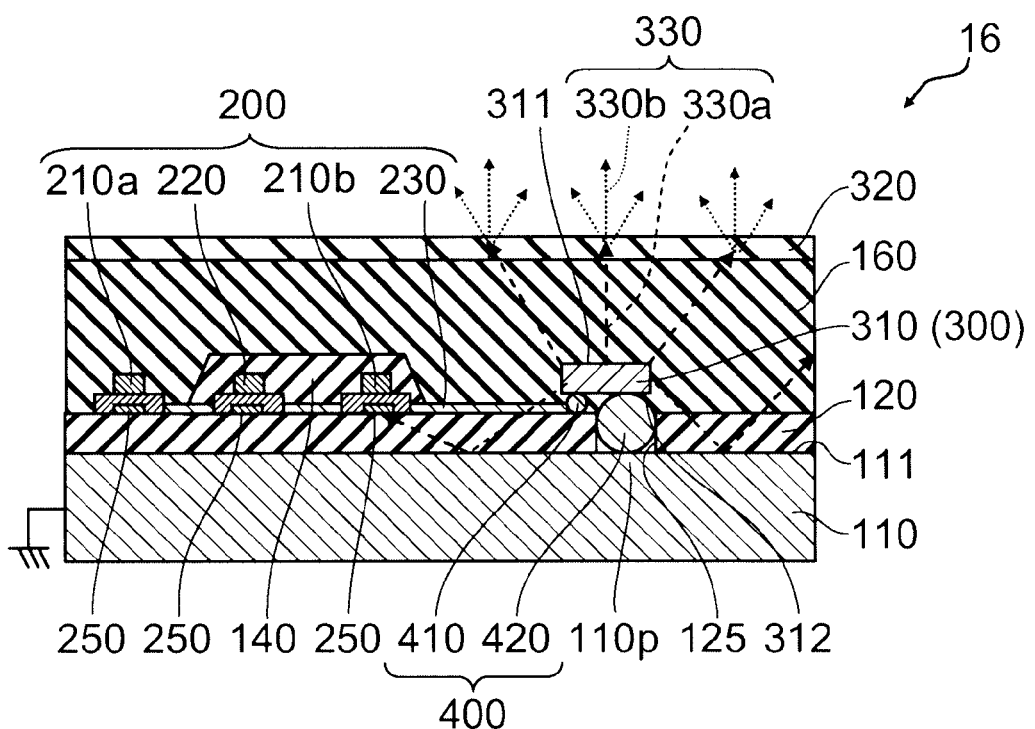
FIG. 13 is a schematic cross-sectional view illustrating the configuration of a light emitting apparatus of another variation according to the first embodiment of the invention.

FIG. 13 is a schematic cross-sectional view illustrating the configuration of a light emitting apparatus of another variation according to the first embodiment of the invention.

In a light emitting apparatus 16 of another variation according to this embodiment illustrated in FIG. 13, a transparent high thermal conductivity layer 160 having a high thermal conductivity while being transparent to the light 330a emitted by the light emitting device chip 310 is used instead of the transparent layer 150 illustrated in FIG. 12. Otherwise, the light emitting apparatus 16 is similar to the light emitting apparatus 15, and a description is omitted.

Thus, by covering the light emitting device chip 310 with the transparent high thermal conductivity layer 160, the heat produced by the light emitting device chip 310 can be conducted and dissipated in a plane parallel to the major surface 111 of the substrate 110. In other words, the heat produced by the light emitting device 300 can be dissipated to the substrate 110 side and simultaneously dissipated upward from the semiconductor device 200 to further increase heat dissipation effects.

In such a case, the portion of the semiconductor device 200 proximal to the light emitting device 300 (in this specific example, the TFT 220 and the second photodiode 210b) are thermally insulated by, for example, being covered with the light-shielding layer 140, which can prevent the temperature from increasing drastically. The temperature at the portions distal to the light emitting device 300 (in this specific example, the first photodiode 210a) increases relatively mildly because the heat escapes upward as the distance from the light emitting device 300 increases.

In such a case as well, the fluorescer-containing layer 320 may be provided on the entire surface of the transparent high thermal conductivity layer 160 or may be provided only on the region irradiated with the light 330a emitted by the light emitting device chip 310.

Figure 14:
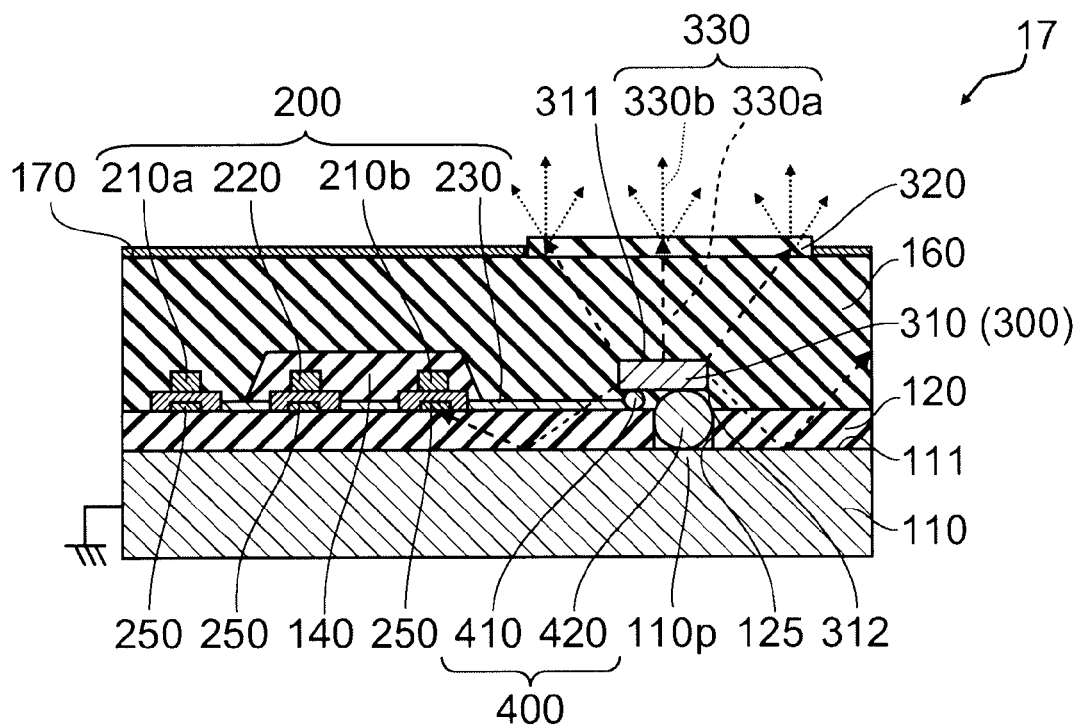
FIG. 14 is a schematic cross-sectional view illustrating the configuration of a light emitting apparatus of another variation according to the first embodiment of the invention.

FIG. 14 is a schematic cross-sectional view illustrating a configuration of a light emitting apparatus of another variation according to the first embodiment of the invention.

As illustrated in FIG. 14, a light emitting apparatus 17 of another variation according to this embodiment is the light emitting apparatus 16 illustrated in FIG. 13 in which the fluorescer-containing layer 320 is provided only on the portion irradiated with the light 330a emitted by the light emitting device chip 310 and a high thermal conductivity layer 170 is provided in the other regions. Otherwise, the light emitting apparatus 17 is similar to the light emitting apparatus 16, and a description is omitted.

Various metals, for example, may be used as the high thermal conductivity layer 170. Thereby, the heat produced by the light emitting device chip 310 can be conducted and dissipated in a plane parallel to the major surface 111 of the substrate 110 by the transparent high thermal conductivity layer 160 and the high thermal conductivity layer 170. In other words, the heat produced by the light emitting device 300 can be dissipated to the substrate 110 side and simultaneously dissipated upward from the semiconductor device 200 to further increase heat dissipation effects.

The high thermal conductivity layer 170 may be provided in the light emitting apparatus 15 illustrated in FIG. 12. In other words, the transparent layer 150 may be used, the fluorescer-containing layer 320 may be provided only on the portion irradiated with the light 330a emitted by the light emitting device chip 310, and the high thermal conductivity layer 170 may be provided on the other regions. In such a case as well, the heat produced by the light emitting device chip 310 can be conducted and dissipated in a plane parallel to the major surface 111 of the substrate 110 by the high thermal conductivity layer 170.

Figure 15:
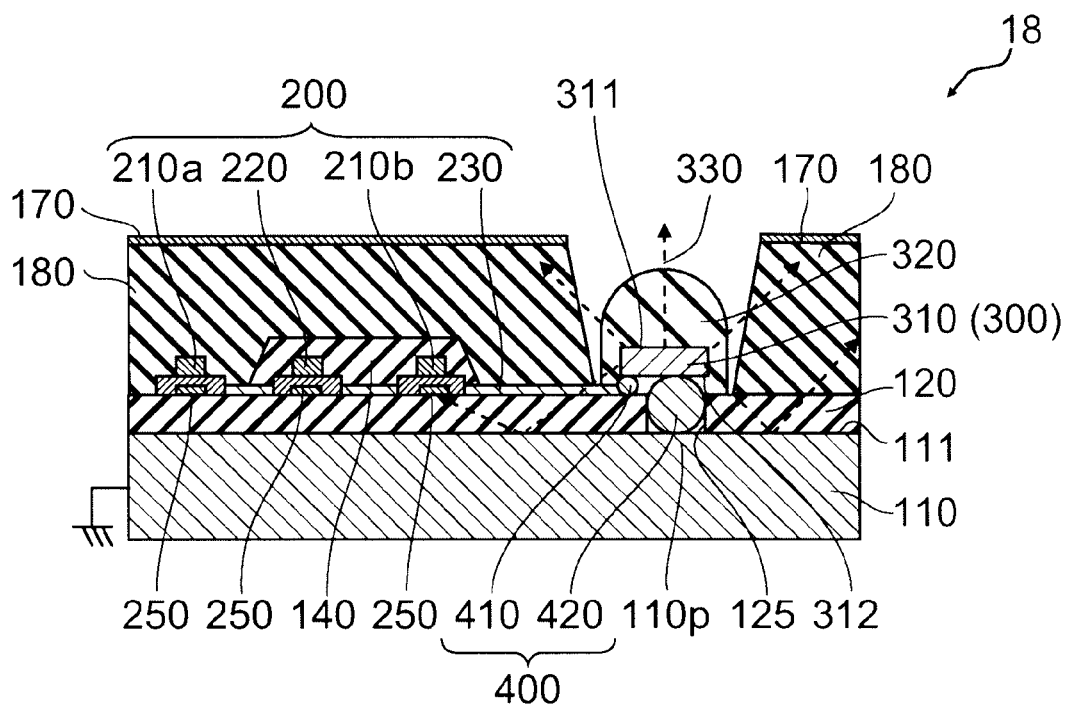
FIG. 15 is a schematic cross-sectional view illustrating the configuration of a light emitting apparatus of another variation according to the first embodiment of the invention.

FIG. 15 is a schematic cross-sectional view illustrating the configuration of a light emitting apparatus of another variation according to the first embodiment of the invention.

As illustrated in FIG. 15, a light emitting apparatus 18 of another variation according to this embodiment is the light emitting apparatus 11 illustrated in FIG. 1 in which an inter-layer insulating film 180 is provided to cover the semiconductor device 200 and the high thermal conductivity layer 170 is provided thereupon. Otherwise, the light emitting apparatus 18 is similar to the light emitting apparatus 11, and a description is omitted.

The inter-layer insulating film 180 may include any material, transparent or light-shielding, including inorganic materials such as silicon oxide, silicon nitride, silicon oxynitride and organic resins such as acryl and polyimide. In the case where the inter-layer insulating film 180 is light-shielding, the light-shielding layer 140 may be omitted. In such a case as well, the high thermal conductivity layer 170 may include any material such as, for example, metal.

Thus, the heat produced by the light emitting device chip 310 can be dissipated to the substrate 110 side and simultaneously dissipated upward from the semiconductor device 200 to further increase heat dissipation effects also by providing the high thermal conductivity layer 170 above the semiconductor device 200 via the inter-layer insulating film 180.

Figure 16:
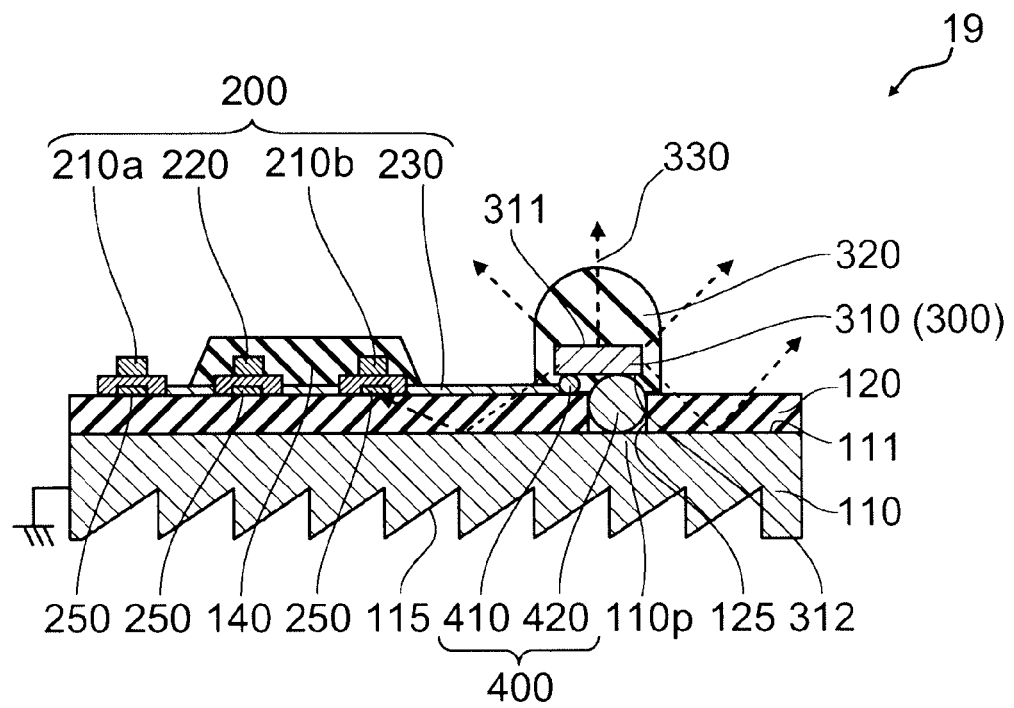
FIG. 16 is a schematic cross-sectional view illustrating the configuration of a light emitting apparatus of another variation according to the first embodiment of the invention.

FIG. 16 is a schematic cross-sectional view illustrating the configuration of a light emitting apparatus of another variation according to the first embodiment of the invention.

As illustrated in FIG. 16, a light emitting apparatus 19 of another variation according to this embodiment is the light emitting apparatus 11 illustrated in FIG. 1 in which recesses and protrusions 115 are provided on a side of the substrate 110 opposite to the major surface 111. Otherwise, the light emitting apparatus 19 is similar to the light emitting apparatus 11, and a description omitted.

Thus, by providing the recesses and protrusions 115 on the side of the substrate 110 opposite to the major surface 111, the surface area of the substrate 110 can be increased, and the heat dissipation effects of the substrate 110 can be increased. Thereby, a highly efficient light emitting apparatus can be realized to dissipate the heat from the light emitting device 300 more efficiently.

The recesses and protrusions 115 of the substrate 110 may have various configurations such as grooves and holes. In other words, the substrate 110 may have fins of various configurations. The recesses and protrusions 115 may be provided in any of the light emitting apparatuses 11, 11a, and 12 to 18 according to the embodiments and the examples of the invention. In such a case as well, the heat dissipation efficiency is further improved.

Figure 17:
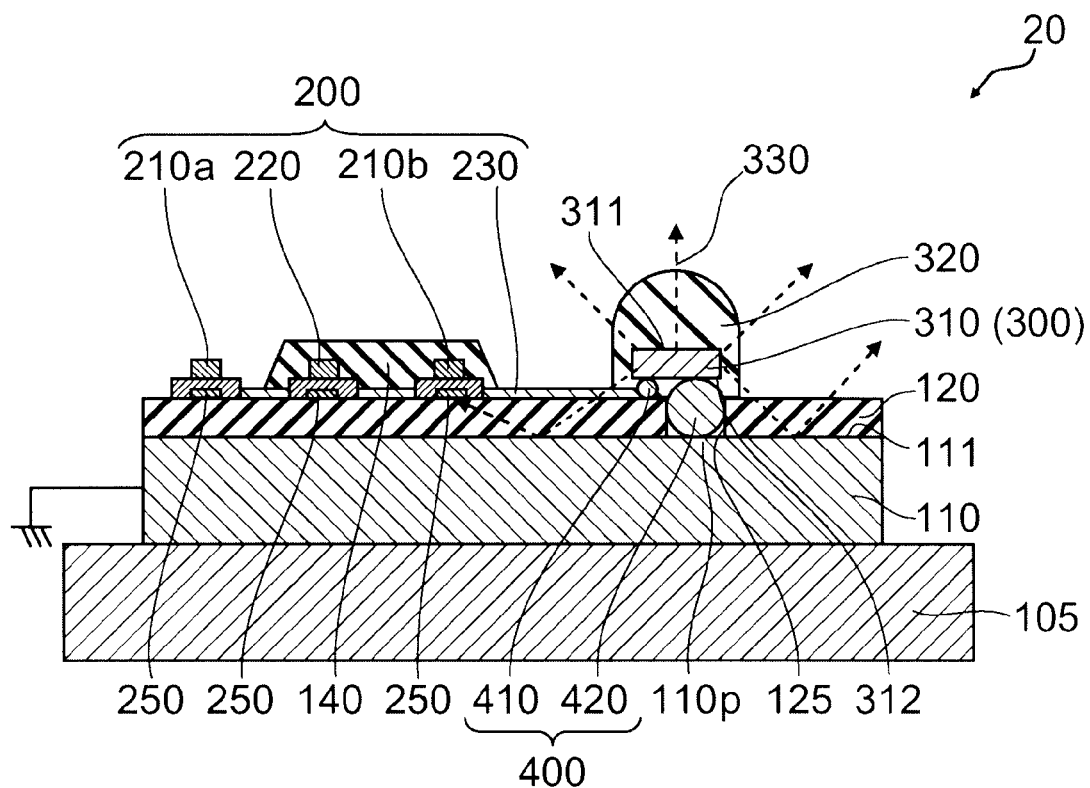
FIG. 17 is a schematic cross-sectional view illustrating the configuration of a light emitting apparatus of another variation according to the first embodiment of the invention.

FIG. 17 is a schematic cross-sectional view illustrating the configuration of a light emitting apparatus of another variation according to the first embodiment of the invention.

As illustrated in FIG. 17, a light emitting apparatus 20 of another variation according to this embodiment further includes a housing 105 thermally connected to the substrate 110. In other words, the light emitting apparatus 20 is the light emitting apparatus 11 illustrated in FIG. 1 in which, for example, the housing 105 of the light emitting apparatus 20 is thermally connected to the side of the substrate 110 opposite to the major surface 111. Otherwise, the light emitting apparatus 20 is similar to the light emitting apparatus 11, and a description is omitted.

Thus, by thermally connecting the substrate 110 to the housing 105, heat can be efficiently dissipated from the substrate 110, and a highly efficient light emitting apparatus can be realized to dissipate the heat from the light emitting device 300 more efficiently.

The thermal connection between the housing 105 and the substrate 110 may be on a surface of the substrate 110 other than the side opposite to the major surface 111, and the housing 105 and the substrate 110 may be connected at any location. The housing 105 may have any configuration and may include any material with good thermal conductivity. The housing 105 may include a heat sink of any configuration.

The housing 105 may be provided in any of the light emitting apparatuses 11, 11a, and 12 to 19 according to the embodiments and the examples of the invention. In such a case as well, the heat dissipation efficiency is further improved. In this case, the housing 105 of the light emitting apparatus can be also electrically connected to the substrate 110.

Figure 18:
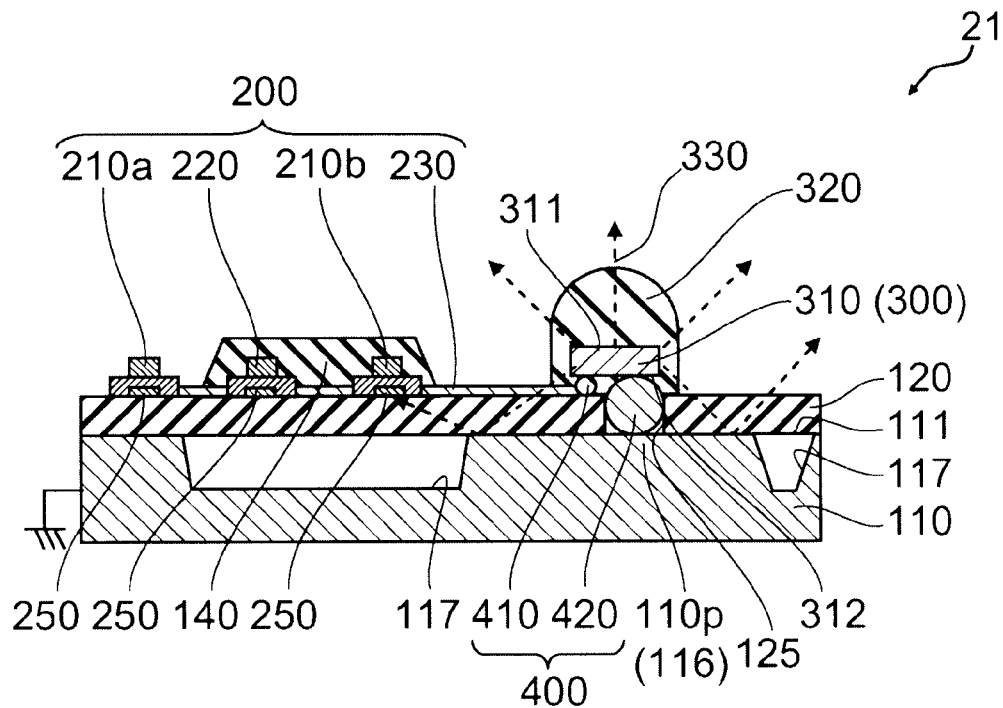
FIG. 18 is a schematic cross-sectional view illustrating the configuration of a light emitting apparatus of another variation according to the first embodiment of the invention.

FIG. 18 is a schematic cross-sectional view illustrating the configuration of a light emitting apparatus of another variation according to the first embodiment of the invention.

As illustrated in FIG. 18, in a light emitting apparatus 21 of another variation according to this embodiment, the substrate 110 includes a high thermal conductivity region 116 (first region) provided in the portion 110p thermally connected to the light emitting device 300 and having a high thermal conductivity and a low thermal conductivity region 117 (second region) provided in portions other than the portion 110p thermally connected to the light emitting device 300 and having a thermal conductivity lower than that of the high thermal conductivity region 116. Otherwise, the light emitting apparatus 21 is similar to the light emitting apparatus 11, and a description is omitted.

The low thermal conductivity region 117 is, for example, a recess provided in the substrate 110. In such a case, the high thermal conductivity region 116 is the substrate 110 itself and is formed of, for example, metal. In other words, the space of the interior of the recess is filled with, for example, air, etc., having a thermal conductivity lower than the metal, etc., used as the substrate 110. Thereby, the low thermal conductivity region 117, i.e., the recess, has a thermal conductivity lower than that of the high thermal conductivity region 116.

Thus, by providing multiple regions having different thermal conductivities in the substrate 110, deformation of the substrate 110 which may occur during the dissipation of heat by the substrate 110 can be suppressed.

In other words, in the case where the substrate 110 has a configuration of a single region having a uniform thermal conductivity, a large temperature difference occurs in the substrate 110 during the dissipation of heat by the substrate 110, large stresses occur in the substrate 110, and distortion easily occurs in the substrate 110. Thereby, for example, negative effects occur on the thermal and electrical connections between the light emitting device 300 and the substrate 110, negative effects occur on the electrical connection between the light emitting device 300 and the semiconductor device 200, and the characteristics of the semiconductor device 200 and the like may deteriorate.

In such a case, for example, by providing the low thermal conductivity region 117 such as the recess in the substrate 110, the stress can be relieved; and thereby, the problems recited above can be suppressed.

In other words, the high thermal conductivity region 116 is disposed in the portion 110p where the light emitting device 300 is connected and the heat of the light emitting device 300 is conducted to the substrate 110 by the high thermal conductivity region 116 of the portion 110p. Thereafter, it is sufficient that the heat is conducted and dissipated in the substrate 110 in a plane parallel to the major surface 111 of the substrate 110. In the portions other than the portions where the light emitting device 300 is connected, the thermal conductivity may be relatively lower than that of the portion 110p where the light emitting device 300 is connected. Thereby, by providing the high thermal conductivity region 116 and the low thermal conductivity region 117 in the substrate 110, the distortion and the deformation of the substrate 110 can be suppressed, and a highly efficient light emitting apparatus can be provided to stably and efficiently dissipate the heat from the light emitting device 300.

The low thermal conductivity region 117 is not limited to a recess provided in the substrate 110 and may be a through-hole passing through the substrate 110 in the thickness direction. The low thermal conductivity region 117 also may be, for example, a resin material filled into, for example, the portions of the recesses and/or the through-holes provided in the substrate 110, where the resin material has a thermal conductivity lower than that of the metal used in the high thermal conductivity region 116. In such a case as well, the concentration of the stress can be relieved by using a material as the low thermal conductivity region 117 having a thermal conductivity lower than that of the material used in the high thermal conductivity region 116 and a material having a rigidity lower than that of the material used in the high thermal conductivity region 116.

In the case where the substrate 110 including the low thermal conductivity region 117 such as a recess on the major surface 111 is used, a special method is used to provide the semiconductor layer 250 and the semiconductor device 200 using the semiconductor layer 250 thereupon. The method in particular will now be described as a second example.

Second Example

A light emitting apparatus 21a (not illustrated) of a second example according to this embodiment will now be described. The light emitting apparatus 21a uses a substrate 110 in which a recess is provided as the low thermal conductivity region 117. The configuration of the light emitting apparatus 21a is similar to the configuration of the light emitting apparatus 21 illustrated in FIG. 18, and a description is omitted. In particular, an example of a method for manufacturing the substrate 110 including the semiconductor device 200 used in the light emitting apparatus 21a will now be described in detail.

FIGS. 19A to 19H are schematic cross-sectional views in order of the processes, illustrating the method for manufacturing another light emitting apparatus according to the second example of the invention.

Figure 19A:
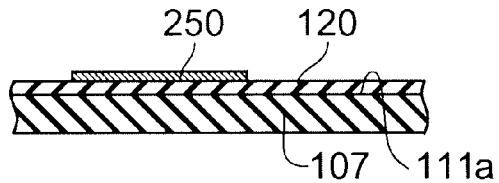
FIGS. 19A to 19H are schematic cross-sectional views in order of the processes, illustrating a method for manufacturing another light emitting apparatus according to a second example of the invention.

As illustrated in FIG. 19A, first, plasma-enhanced metal organic chemical vapor deposition (PEMOCVD) and the like was used with, for example, a source material of trimethylaluminium and the like to deposit an alumina film having excellent resistance to hydrofluoric acid to form the insulating layer 120 on a major surface 111a of a substrate 107 (support substrate) made of sufficiently cleaned alkali-free glass. At this time, it is necessary to use a substrate temperature of not less than 500° C. to deposit the alumina film. This temperature is necessary to promote the thermal decomposition of the organometallic complex, and because a high amount of thermal energy is necessary to promote reactions and migration proximal to the substrate to form the alumina film with structures that have excellent resistance to hydrofluoric acid. The source material and the film formation method of the alumina film are not limited to those recited above. Any source material and any method may be used.

The insulating layer 120 made of the alumina film functions to suppress trace components and the like from eluting from the alkali-free glass substrate 107 when manufacturing the thin film transistor described below and to separate the alkali-free glass substrate 107 from devices such as the thin film transistor and the interconnect portions when removing the alkali-free glass substrate 107.

Then, to form the semiconductor layer 250, for example, after growing a silicon film in an amorphous form using PECVD, the film was multicrystallized by crystallizing the film after instantaneously melting by irradiation with an excimer laser using KrF and the like. Then, for example, anisotropic etching was performed using reactive ion etching (RIE) by fluorine-containing gas, devices of the polycrystalline silicon layer were separated, and an island-like structure was formed.

Figure 19B:
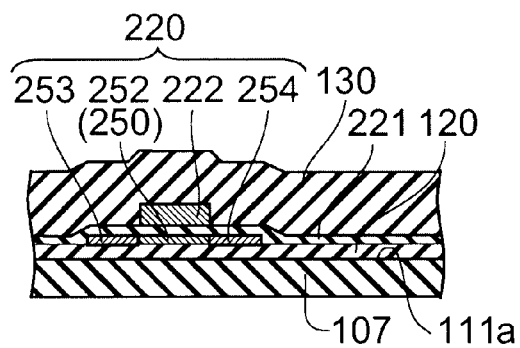

Continuing as illustrated in FIG. 19B, a silicon oxide film was formed to form the gate insulating film 221 using, for example, PECVD. The gate insulating film 221 is not limited to a silicon nitride film or a silicon oxynitride film, and any film formation method may be used.

Then, a metal film made of Mo was deposited using, for example, sputtering to form the gate electrode 222 thereupon. The metal film may include, for example, any material such as Mo, W, Ta, and an alloy thereof. Any film formation method thereof may be used.

Subsequently, a photoresist was coated on the metal film, a resist pattern was formed by photolithography, and the metal film was patterned into configurations of the gate electrode 222 and a group of gate lines (not illustrated) by selectively removing the metal film from portions where the resist pattern did not exist.

An impurity was introduced to form a junction surface on the semiconductor layer 250. In this example, phosphorus (P) was used as the impurity. At this time, the gate electrode 222 was used as a mask to introduce phosphorus (P) by ion doping with an ion concentration of about $10^{22}$ cm$^{-3}$. Thereby, the contact layer 253 and the contact layer 254 were formed to be connected to the source electrode 223 and the drain electrode 224 described below, respectively. The channel 252 of the TFT 220 also was formed on the substrate 107 side of the gate electrode 222.

Then, a silicon oxide film was formed by, for example, APCVD to form the passivation film 130. The film formation method of the passivation film 130 is not limited to APCVD, and any method may be used. Instead of the silicon oxide film, the material thereof may include any material such as a silicon nitride film or a silicon oxynitride film.

At this time, the passivation film 130 functions as a protective layer of the semiconductor device 200 including the interconnect 230 in a transfer process described below.

Figure 19C:
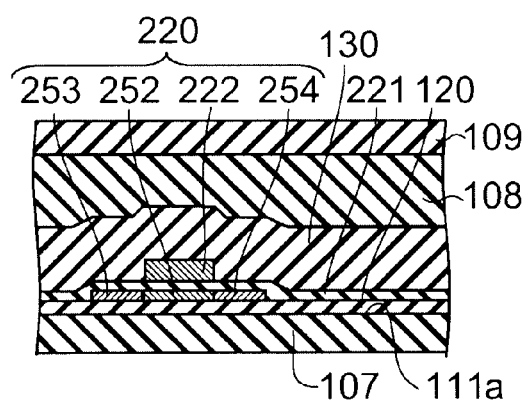

Continuing as illustrated in FIG. 19C, a bonding agent is coated on the passivation film 130 to form a temporary bonding layer 108. The bonding agent has excellent resistance to hydrofluoric acid, and the bonding force thereof weakens, for example, when irradiated with ultraviolet light. A resin sheet that contains fluorine, has excellent resistance to hydrofluoric acid, and is coated with a layer to improve adhesion with organic materials is disposed thereupon to form a temporary support substrate 109 opposing the temporary bonding layer 108.

Figure 19D:
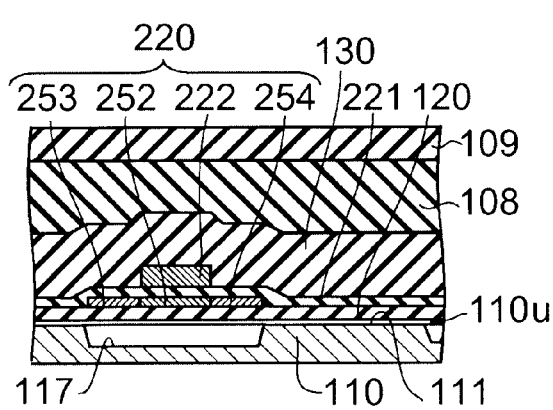

Then, as illustrated in FIG. 19D, the alkali-free glass substrate 107 was polished using an abrasive from the bottom face side of the alkali-free glass substrate 107 opposite to the major surface 111a to a thickness of about 0.1 mm while adjusting the fineness of the abrasive. Then, the alkali-free glass substrate 107 was dissolved by impregnating a solvent containing hydrofluoric acid. At this time, after the alkali-free glass substrate 107 became thin, the etching rate was adjusted by, for example, using a solvent including ammonium and the like added to a solution containing hydrofluoric acid.

At this time, because the alumina film, i.e., the insulating layer 120, has a high resistance to hydrofluoric acid with respect to the alkali-free glass substrate 107, the etching stops when the alumina surface is exposed.

At this time, an accumulated capacitance electrode (not illustrated) may be formed using a photo-etching process after depositing metal such as Mo, Ta, W, Al, Ni, alloys thereof, stacked films thereof, etc., on the alumina film, i.e., the insulating layer 120 (on the surface of the alumina film on the side opposite to the semiconductor layer 250) using, for example, sputtering and the like.

Then, a bonding layer 110u was formed on the surface of the alumina film on the side opposite to the semiconductor layer 250 using a bonding agent having excellent adhesion.

The substrate 110 made of stainless steel with a thickness of about 0.3 mm was bonded to the surface of the bonding layer 110u on the side opposite to the alumina film using, for example, vacuum laminating. As described above, the substrate 110 includes a recess (the low thermal conductivity region 117) in the portion other than the portion 110p where the light emitting device 300 is subsequently connected. Although the substrate 110 may include any material having excellent thermal conductivity, it is desirable to use, for example, metal, which simultaneously is electrically conductive. Any method may be used to bond the bonding layer 110u to the substrate 110.

Figure 19E:
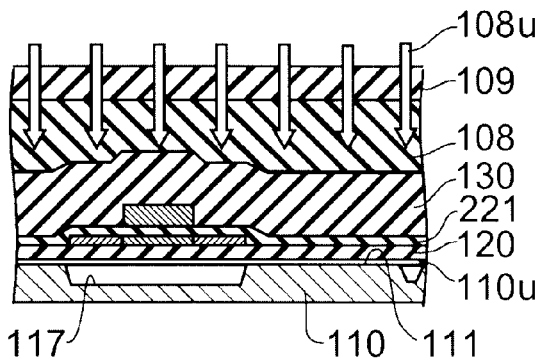

Continuing as illustrated in FIG. 19E, processing was performed to weaken the bonding force of the temporary bonding layer 108 by irradiating the temporary bonding layer 108 with ultraviolet light 108u from the temporary support substrate 109 side.

Figure 19F:
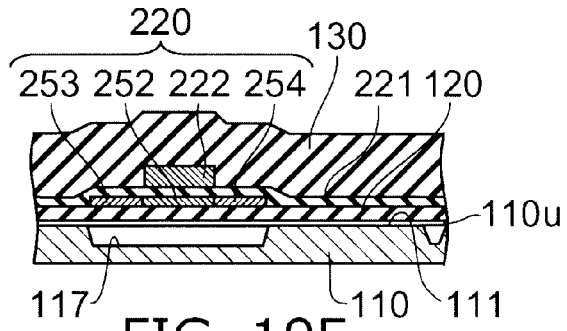

Then, as illustrated in FIG. 19F, the temporary bonding layer 108 and the temporary support substrate 109 were peeled together to expose the passivation film 130. At this time, a portion of the components of the temporary bonding layer 108 remain on the passivation film 130 and are removed in such a case by cleaning using an organic solvent such as, for example, isopropyl alcohol to expose the passivation film 130. By using a material as the bonding layer 110u having resistance to the solvent used to clean the temporary bonding layer 108, the substrate 110 does not peel due to damage of the bonding layer 110u when the temporary bonding layer 108 is cleaned.

Figure 19G:
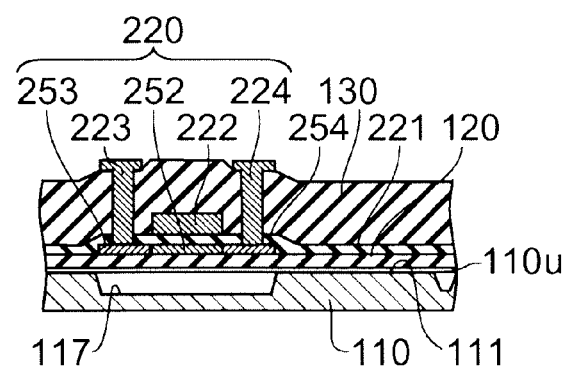

Subsequently, as illustrated in FIG. 19G, through-holes (not illustrated) were made in the passivation film 130 and the gate insulating film 221 at prescribed positions by a photo-etching process. The interiors thereof were filled by an electrically conductive film of, for example, metal such as Mo, Ta, W, Al, Ni, alloys thereof, stacked films thereof, etc., to form the source electrode 223 and the drain electrode 224. The electrically conductive film forming the source electrode 223 and the drain electrode 224 was patterned into a prescribed configuration to form the interconnect 230.

Thus, the semiconductor device 200 (the TFT 220 and the interconnect 230) were formed integrally on the major surface 111 of the substrate 110.

The semiconductor layer 250 is formed on the insulating layer 120 integrally with the insulating layer 120. The semiconductor device 200 includes the semiconductor layer 250 formed integrally with the insulating layer 120 provided on the major surface 111 of the substrate 110.

Figure 19H:
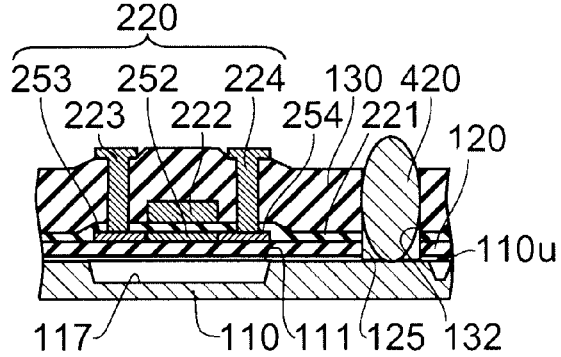

Subsequently, as illustrated in FIG. 19H, the through-hole 132 was made in the insulating layer 120, the gate insulating film 221, and the passivation film 130 at a position corresponding to the second bump 420 to form a contact between the substrate 110 and the light emitting device 300. The opening 125 is made in the insulating layer 120 when making the through-hole 132. Subsequently, the light-shielding layer 140 (not illustrated) was formed in a configuration in which the portion of the through-hole 132 was opened. Then, the second bump 420 was provided in the portion of the through-hole 132.

Subsequently, an LED chip, i.e., the light emitting device chip 310 of the light emitting device 300, was mounted on the substrate 110 using the bumps by a flip chip method. Thereafter, the fluorescer-containing layer 320 was formed by dropping and curing a thermosetting resin containing a fluorescer proximally to the LED chip, and the light emitting apparatus 21a having the configuration illustrated in FIG. 18 was constructed.

The light emitting apparatus 21a constructed according to the second example can provide a highly efficient light emitting apparatus in which the high thermal conductivity region 116 and the low thermal conductivity region 117 are provided on the substrate 110 to suppress deformation of the substrate 110 and stably and efficiently dissipate the heat from the light emitting device 300. As recited above, a light emitting apparatus can be manufactured using the substrate 110 in which the low thermal conductivity region 117 such as a recess is provided by forming the semiconductor device 200 on a temporary support substrate (the alkali-free glass substrate 107) and then by using a process to transfer the configuration onto the substrate 110 (hereinbelow taken to be a transfer process).

As recited above, even in the case where, for example, the semiconductor layer 250 (and the semiconductor device 200) are attached to the substrate 110 by a transfer process, the semiconductor layer 250 (and the semiconductor device 200) are affixed to and formed integrally with the substrate 110.

A transfer process such as that recited above also may be used to manufacture, for example, the light emitting apparatus 11a including the substrate 110 in which the low thermal conductivity region 117 such as a recess is not provided.

Thus, the light emitting apparatus 21a according to this embodiment includes: a substrate 110; the semiconductor device 200 including the insulating layer 120 provided on the major surface 111 of the substrate 110 and the semiconductor layer 250 formed on the insulating layer 120 integrally with the insulating layer 120; and the light emitting device 300 formed separately from the substrate 110. The light emitting device 300 is mounted on the major surface 111 of the substrate 110 through the opening 125 of the insulating layer 120, electrically connected to the semiconductor device 200, and thermally connected to the substrate 110. The substrate 110 is electrically conductive, and the light emitting device 300 is electrically connected to the substrate 110 through the opening 125 recited above.

As described above, according to the light emitting apparatus according to the embodiments of the invention, the light emitting device 300 can be mounted on the substrate 110 without causing deterioration of the heat generation performance or device breakdown, where the substrate 110 includes passive devices having interconnect functions, etc., and active devices such as thin film transistors formed beforehand. The interconnect paths can be increased without increasing the number of stacks. Further, it is possible to suppress the effects on the active devices provided on the substrate 110 resulting from the light emitted from the mounted light emitting device 300 and from the power transmission for driving the mounted light emitting device 300.

Second Embodiment

A method for manufacturing a light emitting apparatus according to a second embodiment of the invention manufactures a light emitting apparatus including the semiconductor device 200 provided on the major surface 111 of the substrate 110 and the light emitting device 300 provided on the major surface 111 of the substrate 110, where the light emitting device 300 is electrically connected to the semiconductor device 200. Characteristics of the manufacturing method will now be described.

Figure 20:
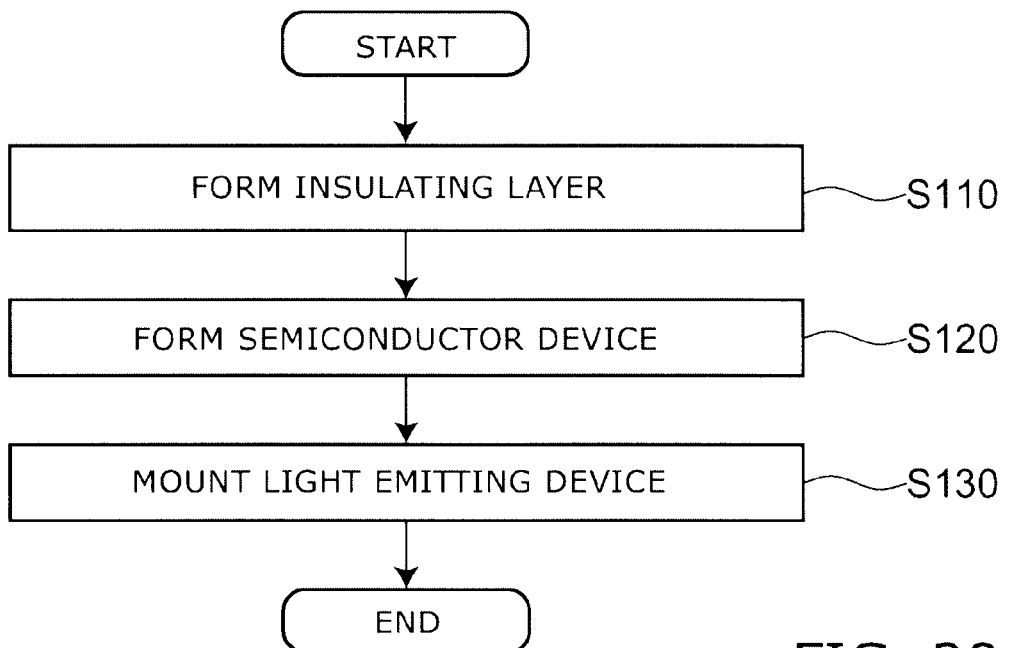
FIG. 20 is a flowchart illustrating a method for manufacturing a light emitting apparatus according to a second embodiment of the invention.

FIG. 20 is a flowchart illustrating the method for manufacturing the light emitting apparatus according to the second embodiment of the invention.

In the method for manufacturing the light emitting apparatus according to this embodiment illustrated in FIG. 20, first, the insulating layer 120 is formed on the major surface 111 of the substrate 110 (step S110). For this process, the method described in regard to FIG. 8A may be used.

Then, the semiconductor layer 250 is formed on the insulating layer 120, and the semiconductor device 200 including the semiconductor layer 250 is formed (step S120). For this process, the method described in regard to, for example, FIGS. 8B to 8F may be used.

Then, the light emitting device 300 is mounted on the major surface 111 of the substrate 110 to connect the light emitting device 300 to the substrate 110 through the opening 125 of the insulating layer 120 (step S130). For this process, the method described in regard to, for example, FIG. 8H may be used.

The opening 125 of the insulating layer 120 may be made between step S120 and step S130, in step S110 when forming the insulating layer 120, or during any process.

Thus, the method for manufacturing the light emitting apparatus according to this embodiment can provide a highly efficient light emitting apparatus that reduces the number of mounted components, enables high integration, and efficiently dissipates the heat from the light emitting device 300.

Third Embodiment

A method for manufacturing a light emitting apparatus according to a third embodiment of the invention also manufactures a light emitting apparatus including the semiconductor device 200 provided on the major surface 111 of the substrate 110 and the light emitting device 300 provided on the major surface 111 of the substrate 110, where the light emitting device 300 is electrically connected to the semiconductor device 200. Characteristics of the manufacturing method will now be described.

Figure 21:
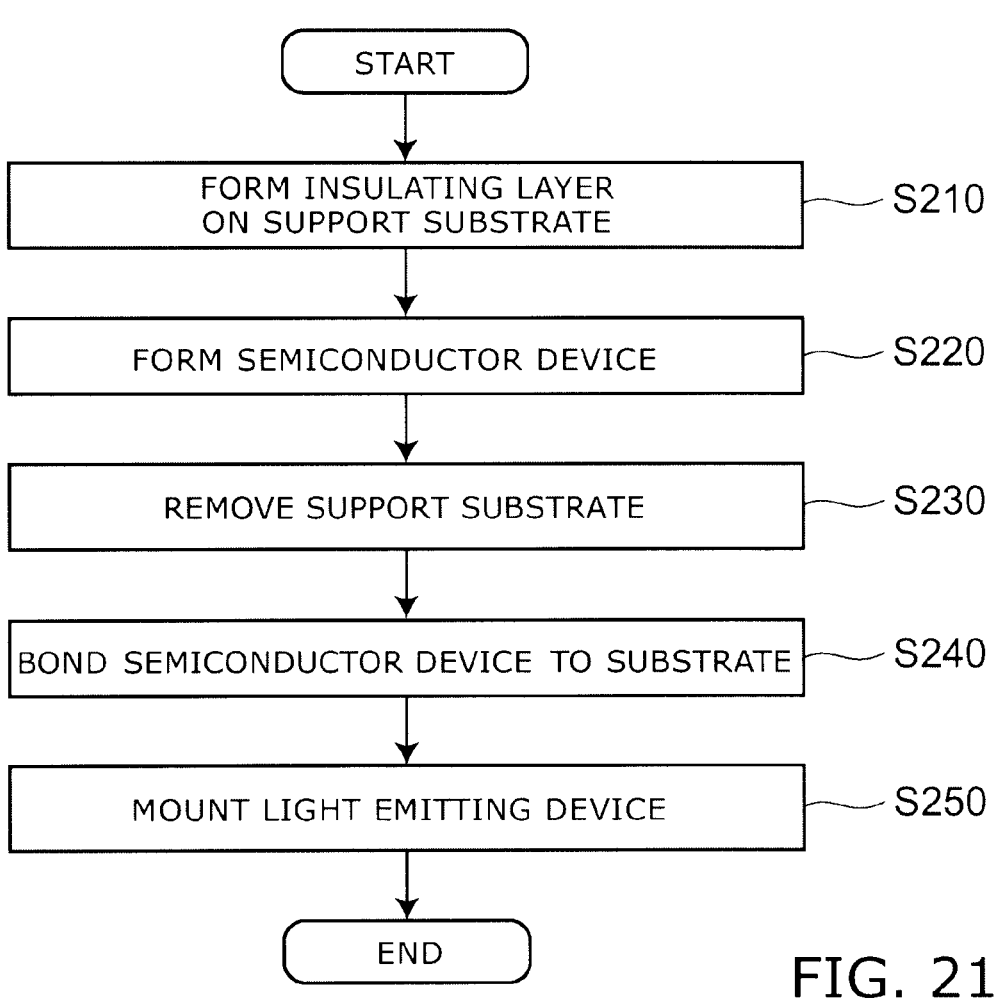
FIG. 21 is a flowchart illustrating a method for manufacturing a light emitting apparatus according to a third embodiment of the invention.

FIG. 21 is a flowchart illustrating the method for manufacturing the light emitting apparatus according to the third embodiment of the invention.

In the method for manufacturing the light emitting apparatus according to this embodiment illustrated in FIG. 21, first, the support substrate 107 (e.g., the alkali-free glass substrate 107) is formed on the insulating layer 120 of the major surface 111a (step S210). For this process, the method described in regard to FIG. 19A may be used.

Then, the semiconductor layer 250 is formed on the insulating layer 120, and the semiconductor device 200 including the semiconductor layer 250 is formed (step S220). For this process, the method described in regard to, for example, FIG. 19B may be used.

Then, the support substrate 107 is removed (step S230). For this process, the method described in regard to, for example, FIGS. 19C and 19D may be used. In other words, the configuration of the semiconductor device 200 can be easily maintained when subsequently removing the support substrate 107 by, for example, forming the temporary bonding layer 108 on the passivation film 130 on the semiconductor device 200 and providing the temporary support substrate 109 such as a resin sheet on the temporary bonding layer 108 prior to removing the support substrate 107, where the bonding force of the temporary bonding layer 108 weakens, for example, when irradiated with ultraviolet light. However, the manufacturing method according to this embodiment is not limited thereto. It is sufficient that the support substrate 107 can be removed while maintaining the configuration of the semiconductor device 200.

Then, the semiconductor device 200 is bonded to the substrate 110 (step S240). For this process, the method described in regard to, for example, FIG. 19D may be used. In the case where the temporary bonding layer 108 or the temporary support substrate 109 is provided, the temporary bonding layer 108 or the temporary support substrate 109 can be removed by the method described in regard to FIG. 19E.

Then, the light emitting device 300 is mounted on the major surface 111 of the substrate 110 to connect the light emitting device 300 to the substrate 110 through the opening 125 of the insulating layer 120 (step S250). For this process, the method described in regard to, for example, FIG. 19H may be used.

The opening 125 of the insulating layer 120 may be made between step S240 and step S250, in step S210 when forming the insulating layer 120, or during any process. The order of steps S210 to S250 recited above is arbitrary as long as the order is technically possible, and the steps are interchangeable or may be implemented simultaneously.

Thus, the method for manufacturing the light emitting apparatus according to this embodiment can provide a highly efficient light emitting apparatus that reduces the number of mounted components, enables high integration, and efficiently dissipates the heat from the light emitting device 300. In the case where such a method is used, a substrate including the low thermal conductivity region 117 such as a recess may be used as the substrate 110; and thereby, deformation of the substrate 110 due to stress can be suppressed, and a highly efficient light emitting apparatus can be provided to more stably and efficiently dissipate the heat from the light emitting device 300.

Hereinabove, exemplary embodiments of the invention are described with reference to specific examples. However, the invention is not limited to these specific examples. For example, one skilled in the art may appropriately select configurations, sizes, material qualities, arrangements, and the like of components forming light emitting apparatuses such as substrates, semiconductor layers, electrically conductive layers, insulating layers, semiconductor devices, light emitting devices, light emitting device chips, fluorescer-containing layers, interconnecting members, etc., or manufacturing methods from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all light emitting apparatuses and methods for manufacturing the same practicable by an appropriate design modification by one skilled in the art based on the light emitting apparatuses and the methods for manufacturing the same described above as exemplary embodiments of the invention also are within the scope of the invention to the extent that the purport of the invention is included.

Furthermore, various variations and alterations within the spirit of the invention will be readily apparent to those skilled in the art. All such variation and alterations should therefore be seen as within the scope of the invention.

The invention claimed is:

1. A light emitting apparatus, comprising:
   a substrate;
   a semiconductor device including a semiconductor layer formed integrally on a major surface of the substrate; and
   a light emitting device formed separately from the substrate, the light emitting device being mounted on the major surface of the substrate, electrically connected to the semiconductor device, and thermally connected to the substrate,
   wherein the substrate is electrically conductive and the light emitting device is electrically connected to the substrate, and
   wherein the substrate further includes an insulating layer provided between the semiconductor layer and the substrate in a portion other than a portion where the light emitting device is electrically connected to the substrate.

2. The apparatus according to claim 1, wherein a thermal conductivity of the substrate is higher than a thermal conductivity of the insulating layer.

3. The apparatus according to claim 1, wherein the substrate includes a first region and a second region, the first region being provided in a portion where the light emitting device is thermally connected to the substrate, the second region being provided in a portion other than the first region and having a thermal conductivity lower than a thermal conductivity of the first region.

4. The apparatus according to claim 1, further comprising:
   a transparent layer provided to cover a light emitting device chip of the light emitting device, the light emitting device chip including a light emitting layer, the transparent layer being transparent to light emitted by the light emitting device chip; and
   a wavelength conversion layer provided on a surface on a side of the transparent layer opposite to the light emitting device chip, the wavelength conversion layer absorbing the light emitted by the light emitting device and emitting light having a wavelength different from a wavelength of the absorbed light.

5. The apparatus according to claim 4, wherein the transparent layer further covers at least a portion of the semiconductor device.

6. The apparatus according to claim 4, wherein the transparent layer has a thermal conductivity higher than a thermal conductivity of the semiconductor layer.

7. The apparatus according to claim 1, further comprising:
   an inter-layer insulating film provided to cover the semiconductor device; and
   a high thermal conductivity layer provided on a side of the inter-layer insulating film opposite to the semiconductor device, the high thermal conductivity layer having a thermal conductivity higher than a thermal conductivity of the inter-layer insulating film.

8. The apparatus according to claim 1, further comprising a light-shielding layer provided to cover at least a portion of the semiconductor device, the light-shielding layer being light-shielding with respect to light emitted by the light emitting device.

9. The apparatus according to claim 1, wherein the insulating layer is transparent to light emitted by the light emitting device.

10. The apparatus according to claim 9, wherein the light emitted by the light emitting device is transmitted in an interior of the insulating layer using the major surface of the substrate as a reflective surface.

11. The apparatus according to claim 1, wherein the semiconductor device includes a transistor having the semiconductor layer as a channel, and a potential of the substrate is set to be a standard reference potential with respect to the transistor.

12. The apparatus according to claim 1, wherein the semiconductor device includes a device to control at least one of a voltage applied to the light emitting device and a current flowing in the light emitting device.

13. The apparatus according to claim 1, wherein the semiconductor device includes a device to detect an intensity of light emitted by the light emitting device.

14. The apparatus according to claim 1, wherein the semiconductor device includes a device to perform wireless communication based on at least one of infrared rays and radio waves.

15. The apparatus according to claim 1, wherein the light emitting device includes at least one of a light emitting diode and a laser diode.

16. The apparatus according to claim 1, wherein:
the substrate includes metal;
the insulating layer includes at least one selected from the group consisting of silicon oxide, silicon nitride, silicon oxynitride, and aluminum oxide; and
the semiconductor layer includes at least one selected from the group consisting of amorphous silicon, polycrystalline silicon, microcrystalline silicon, oxide semiconductor, and organic semiconductor.

* * * * *